(12) United States Patent
Yuan et al.

(10) Patent No.: US 12,322,335 B2
(45) Date of Patent: Jun. 3, 2025

(54) PIXEL CIRCUIT AND DRIVING METHOD THEREFOR, AND DISPLAY PANEL

(71) Applicants: Chengdu BOE Optoelectronics Technology Co., Ltd., Sichuan (CN); BOE Technology Group Co., Ltd., Beijing (CN)

(72) Inventors: Changlong Yuan, Beijing (CN); Xilei Cao, Beijing (CN); Li Zhu, Beijing (CN); Benlian Wang, Beijing (CN); Zhenhua Zhang, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/278,552

(22) PCT Filed: Jul. 15, 2022

(86) PCT No.: PCT/CN2022/106020
§ 371 (c)(1),
(2) Date: Aug. 23, 2023

(87) PCT Pub. No.: WO2023/005695
PCT Pub. Date: Feb. 2, 2023

(65) Prior Publication Data
US 2024/0135875 A1 Apr. 25, 2024
US 2024/0233637 A9 Jul. 11, 2024

(30) Foreign Application Priority Data

Jul. 30, 2021 (WO) ................ PCT/CN2021/109890
Aug. 5, 2021 (CN) ......................... 202110898658.9

(51) Int. Cl.
*G09G 3/3233* (2016.01)
*G09G 3/3225* (2016.01)
(Continued)

(52) U.S. Cl.
CPC ......... *G09G 3/3233* (2013.01); *G09G 3/3225* (2013.01); *G09G 3/3266* (2013.01);
(Continued)

(58) Field of Classification Search
CPC .. G09G 3/3233; G09G 3/3225; G09G 3/3266; G09G 3/3275; G09G 3/3291;
(Continued)

(56) References Cited

U.S. PATENT DOCUMENTS 10,381,426 B2   8/2019   Ka et al.
10,388,239 B2   8/2019   Lin et al.
(Continued)

FOREIGN PATENT DOCUMENTS

CN   102467876 A   5/2012
CN   103778889 A   5/2014
(Continued)

OTHER PUBLICATIONS

Mar. 1, 2024—(US) Non-Final Office Action—U.S. Appl. No. 18/273,695.
(Continued)

*Primary Examiner* — Amit Chatly
(74) *Attorney, Agent, or Firm* — Banner & Witcoff, Ltd.

(57) ABSTRACT

A pixel circuit and a driving method therefor, and a display panel. The pixel circuit includes a driving circuit, a data writing circuit, a compensation storage circuit, a first light-emitting control circuit and a second light-emitting control circuit. The driving circuit includes a control end, a first end, and a second end, and is configured to control a driving current which flows through the first end and the second end
(Continued)

and which is used for driving a light-emitting element to emit light; the data writing circuit is connected to a first scanning signal line and is configured to, in response to a first scanning signal provided by the first scanning signal line, write a data signal into the first end of the driving circuit; the data writing circuit and the first light-emitting control circuit repel one another in a connected state under the control of the first scanning signal.

19 Claims, 15 Drawing Sheets

(51) Int. Cl.
- G09G 3/3266 (2016.01)
- G09G 3/3275 (2016.01)
- G09G 3/3291 (2016.01)
- H10K 59/121 (2023.01)
- H10K 59/126 (2023.01)

(52) U.S. Cl.
CPC ......... *G09G 3/3275* (2013.01); *G09G 3/3291* (2013.01); *H10K 59/1213* (2023.02); *G09G 2300/0426* (2013.01); *G09G 2300/0452* (2013.01); *G09G 2300/0819* (2013.01); *G09G 2300/0842* (2013.01); *G09G 2300/0852* (2013.01); *G09G 2300/0861* (2013.01); *G09G 2310/0251* (2013.01); *G09G 2310/061* (2013.01); *G09G 2310/08* (2013.01); *G09G 2320/0233* (2013.01); *G09G 2320/0247* (2013.01); *G09G 2320/045* (2013.01); *G09G 2330/021* (2013.01); *H10K 59/1216* (2023.02); *H10K 59/126* (2023.02)

(58) Field of Classification Search
CPC ... G09G 2300/0426; G09G 2300/0452; G09G 2300/0819; G09G 2300/0842; G09G 2300/0852; G09G 2300/0861; G09G 2310/0251; G09G 2310/061; G09G 2310/08; G09G 2320/0233; G09G 2320/0247; G09G 2320/045; G09G 2330/021; G09G 3/3208; G09G 2310/0264; H10K 59/1213; H10K 59/1216; H10K 59/126
See application file for complete search history.

(56) References Cited

U.S. PATENT DOCUMENTS

| | | | |
|---|---|---|---|
| 10,431,153 B2 | 10/2019 | Gao et al. | |
| 10,529,283 B2 | 1/2020 | Chai et al. | |
| 10,720,102 B2 | 7/2020 | Umeda et al. | |
| 10,916,198 B2 | 2/2021 | Lin et al. | |
| 10,984,725 B1 | 4/2021 | He et al. | |
| 11,049,458 B1 | 6/2021 | Fan et al. | |
| 11,068,092 B2 | 7/2021 | Han et al. | |
| 11,222,587 B2 | 1/2022 | Toyomura | |
| 11,263,960 B2 | 3/2022 | Xiong et al. | |
| 11,282,461 B2 | 3/2022 | Li et al. | |
| 11,373,582 B2 | 6/2022 | Lee et al. | |
| 11,386,838 B2 | 7/2022 | Gao | |
| 11,393,396 B2 | 7/2022 | Yang et al. | |
| 2008/0150846 A1 | 6/2008 | Chung | |
| 2009/0028955 A1 | 11/2009 | Oku | |
| 2009/0289876 A1 | 11/2009 | Chun | |
| 2012/0105410 A1 | 5/2012 | Choi et al. | |
| 2012/0147060 A1 | 6/2012 | Jeong | |
| 2015/0077412 A1 | 3/2015 | Nakamura | |
| 2015/0154906 A1 | 6/2015 | Chung | |
| 2017/0124941 A1 | 5/2017 | Na et al. | |
| 2017/0193901 A1 | 7/2017 | Wang et al. | |
| 2018/0047337 A1 | 2/2018 | Zhu et al. | |
| 2018/0301092 A1 | 10/2018 | Ma | |
| 2019/0005764 A1 | 2/2019 | Lin et al. | |
| 2019/0005802 A1 | 2/2019 | Woo et al. | |
| 2019/0057646 A1 | 2/2019 | Lin et al. | |
| 2020/0160788 A1 | 5/2020 | Son | |
| 2020/0018489 A1 | 6/2020 | Dong | |
| 2020/0286972 A1 | 9/2020 | Seo et al. | |
| 2020/0312223 A1 | 10/2020 | Yuan et al. | |
| 2020/0388229 A1 | 12/2020 | Zhang et al. | |
| 2020/0394961 A1 | 12/2020 | Kim et al. | |
| 2021/0027696 A1 | 1/2021 | Kim et al. | |
| 2021/0118361 A1 | 4/2021 | Li | |
| 2021/0125557 A1 | 4/2021 | Na | |
| 2021/0174736 A1 | 6/2021 | Yang et al. | |
| 2021/0193049 A1 | 6/2021 | Lin et al. | |
| 2021/0225282 A1 | 7/2021 | Cho et al. | |
| 2021/0280130 A1 | 9/2021 | Wang et al. | |
| 2021/0287605 A1 | 9/2021 | Wang et al. | |
| 2021/0366397 A1 | 11/2021 | Na | |
| 2021/0375193 A1 | 12/2021 | Son et al. | |
| 2021/0383752 A1* | 12/2021 | Yang | G09G 3/3233 |
| 2021/0407383 A1 | 12/2021 | Lai et al. | |
| 2022/0005414 A1 | 1/2022 | Liu et al. | |
| 2022/0130322 A1 | 4/2022 | Yuan et al. | |
| 2022/0013996 A1 | 5/2022 | Li et al. | |
| 2022/0016521 A1 | 5/2022 | Huang et al. | |
| 2022/0157238 A1 | 5/2022 | Wang et al. | |
| 2022/0165984 A1 | 5/2022 | Choi et al. | |
| 2022/0208932 A1 | 6/2022 | Yun | |
| 2022/0270552 A1 | 8/2022 | Roh et al. | |
| 2022/0310017 A1 | 9/2022 | Yang | |
| 2022/0343852 A1 | 10/2022 | Wang et al. | |
| 2022/0376024 A1 | 11/2022 | Zheng et al. | |
| 2023/0036060 A1 | 11/2023 | Wang et al. | |
| 2024/0000137 A1 | 1/2024 | Zhang et al. | |
| 2024/0013727 A1 | 1/2024 | Zhang et al. | |

FOREIGN PATENT DOCUMENTS

| | | |
|---|---|---|
| CN | 102568374 B | 9/2015 |
| CN | 105427803 A | 3/2016 |
| CN | 105427806 A | 3/2016 |
| CN | 205920745 U | 2/2017 |
| CN | 106910468 A | 6/2017 |
| CN | 107146577 A | 9/2017 |
| CN | 107256695 A | 10/2017 |
| CN | 107274830 A | 10/2017 |
| CN | 107358918 A | 11/2017 |
| CN | 107564468 A | 1/2018 |
| CN | 107610651 A | 1/2018 |
| CN | 108133687 A | 6/2018 |
| CN | 108206008 A | 6/2018 |
| CN | 108777130 A | 11/2018 |
| CN | 109215582 A | 1/2019 |
| CN | 109215585 A | 1/2019 |
| CN | 109285500 A | 1/2019 |
| CN | 109427293 A | 3/2019 |
| CN | 109509427 A | 3/2019 |
| CN | 109599062 A | 4/2019 |
| CN | 109817165 A | 5/2019 |
| CN | 110021273 A | 7/2019 |
| CN | 110033734 A | 7/2019 |
| CN | 110176213 A | 8/2019 |
| CN | 110648629 A | 1/2020 |
| CN | 110660360 A | 1/2020 |
| CN | 110767163 A | 2/2020 |
| CN | 111158514 A | 5/2020 |
| CN | 111199711 A | 5/2020 |
| CN | 111354307 A | 6/2020 |
| CN | 111354314 A | 6/2020 |
| CN | 111435587 A | 7/2020 |
| CN | 111445854 A | 7/2020 |
| CN | 111489700 A | 8/2020 |
| CN | 111508426 A | 8/2020 |
| CN | 111583866 A | 8/2020 |
| CN | 111710299 A | 9/2020 |
| CN | 111724745 A | 9/2020 |

(56) References Cited

FOREIGN PATENT DOCUMENTS

| | | |
|---|---|---|
| CN | 111754922 A | 10/2020 |
| CN | 111754938 A | 10/2020 |
| CN | 111883055 A | 11/2020 |
| CN | 112053661 A | 12/2020 |
| CN | 112086062 A | 12/2020 |
| CN | 112116890 A | 12/2020 |
| CN | 112133253 A | 12/2020 |
| CN | 112309316 A | 2/2021 |
| CN | 112331678 A | 2/2021 |
| CN | 112382235 A | 2/2021 |
| CN | 112397026 A | 2/2021 |
| CN | 112397029 A | 2/2021 |
| CN | 112397030 A | 2/2021 |
| CN | 112397565 A | 2/2021 |
| CN | 112420794 A | 2/2021 |
| CN | 112435630 A | 3/2021 |
| CN | 112599099 A | 4/2021 |
| CN | 112712774 A | 4/2021 |
| CN | 112753065 A | 5/2021 |
| CN | 112767873 A | 5/2021 |
| CN | 112992071 A | 6/2021 |
| CN | 113097247 A | 7/2021 |
| CN | 113140179 A | 7/2021 |
| CN | 113224123 A | 8/2021 |
| CN | 113450717 A | 9/2021 |
| CN | 113838419 A | 12/2021 |
| CN | 114627807 A | 6/2022 |
| CN | 114694586 A | 7/2022 |
| JP | 2007011214 A | 1/2007 |
| JP | 2019128447 A | 8/2019 |
| KR | 20090122119 A | 11/2009 |
| KR | 20130007214 A | 1/2013 |
| KR | 20130055450 A | 5/2013 |
| KR | 20170049778 A | 5/2017 |
| WO | WO-2019037543 A1 * 2/2019 ........... G09G 3/3208 |
| WO | 2019163402 A1 | 8/2019 |
| WO | 2020037767 A1 | 2/2020 |

OTHER PUBLICATIONS

Jun. 13, 2024—(US) Non-Final Office Action—U.S. Appl. No. 17/788,727.
Jun. 25, 2024—(US) Non-Final Office Action—U.S. Appl. No. 18/279,621.
Aug. 12, 2024—(US) Non-Final Office Action—U.S. Appl. No. 18/270,094.
Dec. 13, 2024—(CN) First Office Action—App 2021108973199 with English translation.
Nov. 22, 2024—(CN) First Office Action—App 2021108986837 with English translation.

* cited by examiner

PIXEL CIRCUIT AND DRIVING METHOD THEREFOR, AND DISPLAY PANEL

CROSS-REFERENCE TO RELATED APPLICATION

This application is a U.S. National Phase Entry of International Application PCT/CN2022/106020 filed Jul. 15, 2022, designating the United States of America and which claims the priority to and benefit of International Patent Application No. PCT/CN2021/109890, filed on Jul. 30, 2021, and Chinese Patent Application No. 202110898658.9, filed on Aug. 5, 2021. The present application claims priority to and the benefit of the above-identified applications and the above-identified applications are incorporated by reference herein in their entirety.

TECHNICAL FIELD

The embodiments of the present disclosure relate to a pixel circuit and a driving method thereof, and a display panel.

BACKGROUND

Organic Light-emitting Diode (OLED) display devices have gradually gained widespread attention from people due to their advantages such as wide viewing angle, high contrast, fast response speed, higher brightness and lower driving voltage compared to inorganic light-emitting display devices. Due to the above characteristics, the organic light-emitting diode (OLED) can be applied to devices with a display function such as a mobile phone, a monitor, a laptop, a digital camera, instruments and meters, etc.

A pixel circuit in the OLED display device generally adopts a matrix drive mode, which is divided into active matrix (AM) drive and passive matrix (PM) drive based on whether switch components are introduced in each pixel unit. Although PMOLED has a simple process and low cost, PMOLED cannot meet the needs of high-resolution large-scale display due to its drawbacks such as cross talk, high power consumption, and low lifespan. In contrast, AMOLED integrates a set of thin film transistors and storage capacitors in the pixel circuit of each pixel. By driving and controlling the thin film transistors and the storage capacitors, the current flowing through the OLED is achieved to be controlled, thus enabling the OLED to emit light as needed. Compared to PMOLED, AMOLED requires lower driving current, lower power consumption, and longer lifespan, and can meet the need of high-resolution and multi grayscale large-scale display. Meanwhile, AMOLED has obvious advantages in visual angle, color restoration, power consumption, and response time, and is suitable for the display device with high information content and high resolution.

SUMMARY

At least one embodiment of the present disclosure provides a pixel circuit, which comprises a driving circuit, a data writing circuit, a compensation storage circuit, a first light-emitting control circuit, and a second light-emitting control circuit; the driving circuit comprises a control terminal, a first terminal, and a second terminal, and is configured to control a driving current flowing through the first terminal and the second terminal for driving a light-emitting element to emit light; the data writing circuit is connected to the first terminal of the driving circuit and a first scanning signal line, and is configured to write a data signal to the first terminal of the driving circuit in response to a first scanning signal provided by the first scanning signal line; the compensation storage circuit is connected to the control terminal and the second terminal of the driving circuit, and is also connected to a second scanning signal line and a first power line, and is configured to store the data signal written by the data writing circuit in response to a second scanning signal provided by the second scanning signal line and to compensate for the driving circuit; the first light-emitting control circuit is connected to the first terminal of the driving circuit, the first power line, and the first scanning signal line, and is configured to apply a first voltage of the first power line to the first terminal of the driving circuit in response to the first scanning signal provided by the first scanning signal line, wherein a conductive state of the data writing circuit and a conductive state of the first light-emitting control circuit under control of the first scanning signal are mutually exclusive; and the second light-emitting control circuit is connected to the second terminal of the driving circuit, a light-emitting control signal line, and a first terminal of the light-emitting element, and is configured to apply the driving current to the light-emitting element in response to a light-emitting control signal provided by the light-emitting control signal line.

For example, in the pixel circuit provided by at least one embodiment of the present disclosure, the driving circuit comprises a driving transistor; a gate electrode of the driving transistor serves as the control terminal of the driving circuit, a first electrode of the driving transistor serves as the first terminal of the driving circuit, and a second electrode of the driving transistor serves as the second terminal of the driving circuit.

For example, in the pixel circuit provided by at least one embodiment of the present disclosure, the data writing circuit comprises a data writing transistor; a gate electrode of the data writing transistor is connected to the first scanning signal line to receive the first scanning signal, a first electrode of the data writing transistor is connected to the data line to receive the data signal, and a second electrode of the data writing transistor is connected to the first terminal of the driving circuit.

For example, in the pixel circuit provided by at least one embodiment of the present disclosure, the first light-emitting control circuit comprises a first light-emitting control transistor; a gate electrode of the first light-emitting control transistor is connected to the first scanning signal line to receive the first scanning signal, a first electrode of the first light-emitting control transistor is connected to the first power line to receive the first voltage, and a second electrode of the first light-emitting control transistor is connected to the first terminal of the driving circuit.

For example, in the pixel circuit provided by at least one embodiment of the present disclosure, a type of the data writing transistor is different from a type of the first light-emitting control transistor.

For example, in the pixel circuit provided by at least one embodiment of the present disclosure, the first light-emitting control transistor is an N-type transistor, and the data writing transistor is a P-type transistor.

For example, in the pixel circuit provided by at least one embodiment of the present disclosure, the gate electrode of the first light-emitting control transistor comprises a first sub-gate electrode and a second sub-gate electrode located at different layers, and an active layer of the first light-emitting control transistor is located between the first sub-gate electrode and the second sub-gate electrode, a layer where the first sub-gate electrode is located is between a layer where the gate electrode of the data writing transistor is located and a layer where the second sub-gate electrode is located, the first sub-gate electrode and the second sub-gate electrode of the first light-emitting control transistor and the gate electrode of the data writing transistor are connected to the first scanning signal line through connection electrodes, respectively, and a layer where the connection electrodes are located is on a side of the layer where the second sub-gate electrode is located away from the layer where the first sub-gate electrode is located and the layer where the gate electrode of the data writing transistor is located.

For example, in the pixel circuit provided by at least one embodiment of the present disclosure, the compensation storage circuit comprises a compensation transistor and a storage capacitor; a gate electrode of the compensation transistor is connected to the second scanning signal line to receive the second scanning signal, a first electrode of the compensation transistor is connected to the second terminal of the driving circuit, and a second electrode of the compensation transistor is connected to the control terminal of the driving circuit; and a first electrode of the storage capacitor is connected to the control terminal of the driving circuit, and a second electrode of the storage capacitor is connected to the first power line.

For example, in the pixel circuit provided by at least one embodiment of the present disclosure, the first scanning signal line and the second scanning signal line are same or different, and the first scanning signal and the second scanning signal are same or different.

For example, in the pixel circuit provided by at least one embodiment of the present disclosure, when the first scanning signal and the second scanning signal are different, a type of the data writing transistor is different from a type of the compensation transistor, and a type of the compensation transistor is the same as a type of the first light-emitting control transistor.

For example, the pixel circuit provided by at least one embodiment of the present disclosure further comprises a reset circuit, the reset circuit is connected to an initial voltage terminal, a first terminal of the light-emitting element, and the control terminal of the driving circuit, and is configured to apply a reset voltage provided by the initial voltage terminal to the first terminal of the light-emitting element and the control terminal of the driving circuit in response to a reset signal.

For example, in the pixel circuit provided by at least one embodiment of the present disclosure, the reset circuit comprises a first reset transistor and a second reset transistor; a gate electrode of the first reset transistor is connected to a first reset signal line to receive a first reset signal as the reset signal, a first electrode of the first reset transistor is connected to the initial voltage terminal to receive the reset voltage, and a second electrode of the first reset transistor is connected to the control terminal of the driving circuit; a gate electrode of the second reset transistor is connected to a second reset signal line to receive a second reset signal as the reset signal, a first electrode of the second reset transistor is connected to the initial voltage terminal to receive the reset voltage, and a second electrode of the second reset transistor is connected to the first terminal of the light-emitting element.

For example, in the pixel circuit provided by at least one embodiment of the present disclosure, the first reset signal line and the second reset signal line are same or different, and the first reset signal and the second reset signal are same or different.

For example, in the pixel circuit provided by at least one embodiment of the present disclosure, the second light-emitting control circuit comprises a second light-emitting control transistor; a gate electrode of the second light-emitting control transistor is connected to the light-emitting control signal line to receive the light-emitting control signal, a first electrode of the second light-emitting control transistor is connected to the second terminal of the driving circuit, and a second electrode of the second light-emitting control transistor is connected to the first terminal of the light-emitting element.

At least one embodiment of the present disclosure also provides a driving method for the pixel circuit according to claim 1, which comprises a reset phase, a data writing and compensation phase, and a light-emitting phase; in the reset phase, a first level of the first scanning signal is input through the first scanning signal line to turn on the first light-emitting control circuit, and the first voltage is applied to the first terminal of the driving circuit through the first light-emitting control circuit that is turned on; in the data writing and compensation phase, a second level of the first scanning signal is input through the first scanning signal line to turn on the data writing circuit, the second scanning signal is input through the second scanning signal line to turn on the compensation storage circuit, the data signal is input through a data line, the data signal is written into the first terminal of the driving circuit through the data writing circuit that is turned on to turn on the driving circuit, the data signal is stored through the compensation storage circuit that is turned on, and the driving circuit is compensated through the compensation storage circuit that is turned on; and in the light-emitting phase, the first scanning signal is input through the first scanning signal line to turn on the first light-emitting control circuit and the driving circuit, the light-emitting control signal is input through the light-emitting control signal line to turn on the second light-emitting control circuit, and the driving current is applied to the light-emitting element through the first light-emitting control circuit, the driving circuit, and the second light-emitting control circuit, which are turned on, to cause the light-emitting element to emit light.

For example, in the driving method provided by at least one embodiment of the present disclosure, the pixel circuit further comprises a reset circuit; the reset circuit is connected to an initial voltage terminal, a first terminal of the light-emitting element, and the control terminal of the driving circuit, and is configured to apply a reset voltage to the first terminal of the light-emitting element and the control terminal of the driving circuit in response to a reset signal; the method further comprises: in the reset phase, the reset signal is input to turn on the reset circuit, and the reset voltage is applied to the first terminal of the light-emitting element and the control terminal of the driving circuit through the reset circuit that is turned on.

At least one embodiment of the present disclosure also provides a display panel including the pixel circuit provided by any embodiment of the present disclosure.

BRIEF DESCRIPTION OF THE DRAWINGS

In order to clearly illustrate the technical solutions of the embodiments of the present disclosure, the drawings of the embodiments will be briefly described in the following; it is obvious that the described drawings are only related to some embodiments of the present disclosure and thus are not limitative to the present disclosure.

DETAILED DESCRIPTION

Figure 1A:
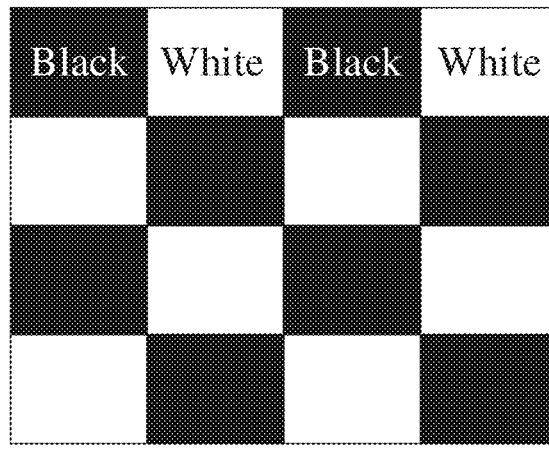
FIG. 1A is a schematic diagram of an image 1 displayed by a display device.

In order to make objects, technical solutions, and advantages of the embodiments of the present disclosure apparent, the technical solutions of the embodiments of the present disclosure will be described in a clearly and fully understandable way in connection with the drawings related to the embodiments of the present disclosure. Apparently, the described embodiments are just a part but not all of the embodiments of the present disclosure. Based on the described embodiments of the present disclosure, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Hereinafter, various embodiments according to the present disclosure will be described in detail with reference to the accompanying drawings. It should be noted that in the drawings, the same reference numerals are given to components having basically the same or similar structures and functions, and repeated descriptions about them will be omitted.

A compensation storage circuit is used to compensate for the threshold voltage variation (or deviation) of a driving transistor comprised in a pixel of an AMOLED display. However, when the compensation storage circuit is used to display an image, due to hysteresis phenomenon, the response speed of the pixel varies according to the increase/decrease of the data voltage applied to the driving transistor, making it difficult to accurately display the grayscale level. When driving the AMOLED display to express brightness from black to white, there is a delay in response speed, and when text is scrolled on the screen, this problem causes sticking, or afterimages.

Figure 1B:
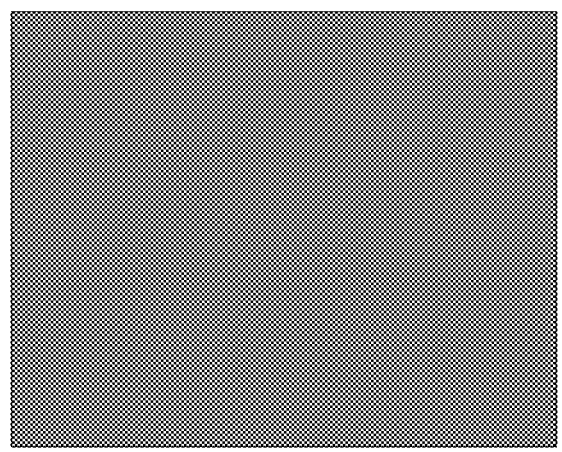
FIG. 1B is a schematic diagram of an image 2 to be displayed by a display device.
Figure 1C:
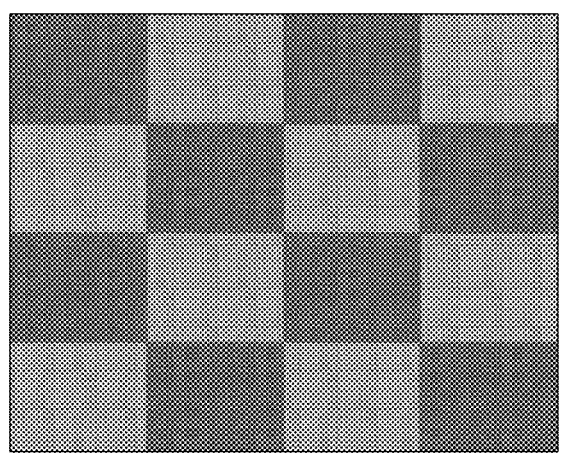
FIG. 1C is a schematic diagram of an image 2 actually displayed by a display device.

The afterimage phenomenon is shown in FIGS. 1A-1C, FIG. 1A is a schematic diagram of an image 1 displayed by a display device, FIG. 1B is a schematic diagram of an image 2 to be displayed by the display device, and FIG. 1C is a schematic diagram of an image 2 actually displayed by the display device. After the display device displays an image such as a black and white checkerboard image as shown in FIG. 1A for a period of time, when the image displayed by the display device is switched to a new image 2 such as an image with a gray scale of 48 as shown in FIG. 1B, a part of the checkerboard image of the image 1 shown in FIG. 1A still remains, as shown in FIG. 1C. For example, first, a black and white grid image (as shown in FIG. 1A) is displayed on the OLED for a short time (e.g., 10s), and then the phenomenon of a residual image is observed in the grayscale image (e.g., 48-level grayscale image as shown in FIG. 1C), after a few seconds or minutes, the residual image shown in FIG. 1C gradually fades out of sight and the image shown in FIG. 1B is displayed.

The reason of appearing the afterimage phenomenon is proved to be related to the hysteresis characteristic of the driving transistor in the pixel circuit. Due to the hysteresis effect of the driving transistor, when a display device displays the same image for a period of time, when the previous display image is switched to the next image, the original previous display image will partially remain and appear in the next image, and the afterimage will disappear after a period of time, this phenomenon is called short-term afterimage. The hysteresis effect is mainly caused by the threshold voltage (Vth) shift caused by the residual mobile ions in the driving transistor. The $V_{GS}$ (a voltage between the gate electrode and the source electrode of the driving transistor) in the initialization phase (that is, the reset phase) may be different when switching between different images, so it may cause different degrees of threshold voltage shift of the driving transistor, resulting in short-term afterimages.

In order to avoid the afterimage phenomenon, a separate transistor and a corresponding gate scanning signal are usually added to control the voltage of the source electrode of the driving transistor, so as to keep the voltage of the source electrode of the driving transistor at a stable potential during the initialization phase, thereby simultaneously resetting the gate voltage Vg and the source voltage Vs of the driving transistor, making the driving transistor in the On-Bias state, so that no matter whether the data voltage of the previous frame display image is black or white, the driving transistor will start data writing and compensation from the On-Bias state, so the short-term afterimage problem can be ameliorated. However, this solution to solving the afterimage problem needs to introduce additional transistors and signals, which is not conducive to the implementation and layout of the pixel circuit.

At least one embodiment of the present disclosure provides a pixel circuit, comprising a driving circuit, a data writing circuit, a compensation storage circuit, a first light-emitting control circuit, and a second light-emitting control circuit. The driving circuit comprises a control terminal, a first terminal, and a second terminal, and is configured to control a driving current flowing through the first terminal and the second terminal for driving a light-emitting element to emit light; the data writing circuit is connected to the first terminal of the driving circuit and a first scanning signal line, and is configured to write a data signal to the first terminal of the driving circuit in response to a first scanning signal provided by the first scanning signal line; the compensation storage circuit is connected to the control terminal and the second terminal of the driving circuit, and is also connected to a second scanning signal line and a first power line, and is configured to store the data signal written by the data writing circuit in response to a second scanning signal provided by the second scanning signal line and to compensate for the driving circuit; the first light-emitting control circuit is connected to the first terminal of the driving circuit, the first power line, and the first scanning signal line, and is configured to apply a first voltage of the first power line to the first terminal of the driving circuit in response to the first scanning signal provided by the first scanning signal line, a conductive state of the data writing circuit and a conductive state of the first light-emitting control circuit under control of the first scanning signal are mutually exclusive; the second light-emitting control circuit is connected to the second terminal of the driving circuit, a light-emitting control signal line, and a first terminal of the light-emitting element, and is configured to apply the driving current to the light-emitting element in response to a light-emitting control signal provided by the light-emitting control signal line.

At least one embodiment of the present disclosure further provides a driving method and a display panel corresponding to the above pixel circuit.

The pixel circuit provided by at least one embodiment of the present disclosure can solve the afterimage problem without adding transistors and control signal lines, which is beneficial to the implementation and layout of the pixel circuit and the promotion of products.

Embodiments of the present disclosure will be described in detail below in conjunction with the accompanying drawings. It should be noted that the same reference numerals will be used in different drawings to refer to the same elements already described.

Figure 2:
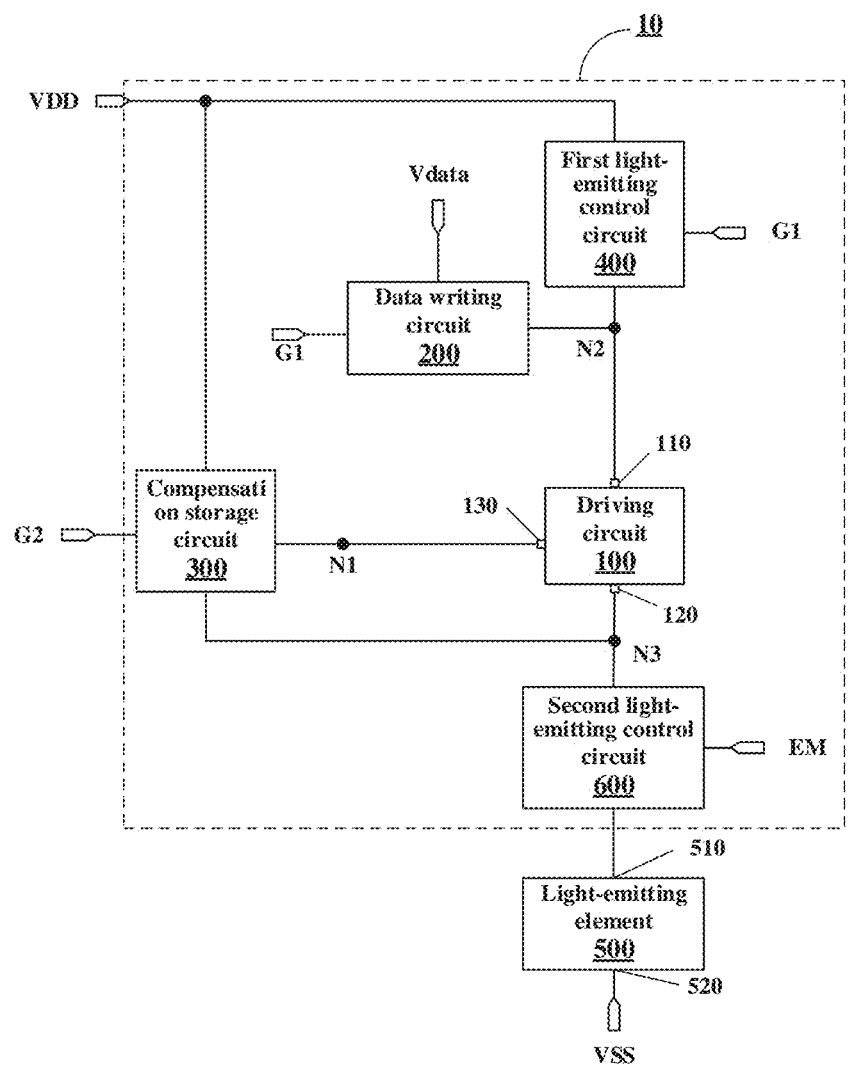
FIG. 2 is a schematic block diagram of a pixel circuit provided in at least one embodiment of the present disclosure.

An example of an embodiment of the present disclosure provides a pixel circuit 10, for example, the pixel circuit 10 is used for a sub-pixel of an OLED display device. As shown in FIG. 2, the pixel circuit 10 includes a driving circuit 100, a data writing circuit 200, a compensation storage circuit 300, a first light-emitting control circuit 400, and a second light-emitting control circuit 600. For example, the pixel circuit 10 is used to drive a light-emitting element 500 to emit light.

For example, the driving circuit 100 includes a first terminal 110, a second terminal 120, and a control terminal 130, and is configured to control a driving current for driving the light-emitting element 500 to emit light, and the control terminal 130 of the driving circuit 100 is connected to a first node N1, and the first terminal 110 of the driving circuit 100 is connected to a second node N2, and the second terminal 120 of the driving circuit 100 is connected to a third node N3. For example, in a light-emitting phase, the driving circuit 100 can provide a driving current to the light-emitting element 500 to drive the light-emitting element 500 to emit light, and the light-emitting element 500 can emit light according to the required "gray scale". For example, the light-emitting element 500 may adopt an OLED and be configured to be connected to the third node N3 and the second power line VSS (for example, providing a low level, such as grounded), and embodiments of the present disclosure include but are not limited to this situation.

For example, in the example shown in FIG. 2, in the case that the pixel circuit 10 includes the second light-emitting control circuit 600, the light-emitting element 500 can be connected to the third node N3 through the second light-emitting control circuit 600, so as to prevent the light-emitting element 500 from emitting light due to the current flowing to the light-emitting element 500 in the non-light-emitting phase. Embodiments of the present disclosure include but are not limited to this situation.

Figure 4A:
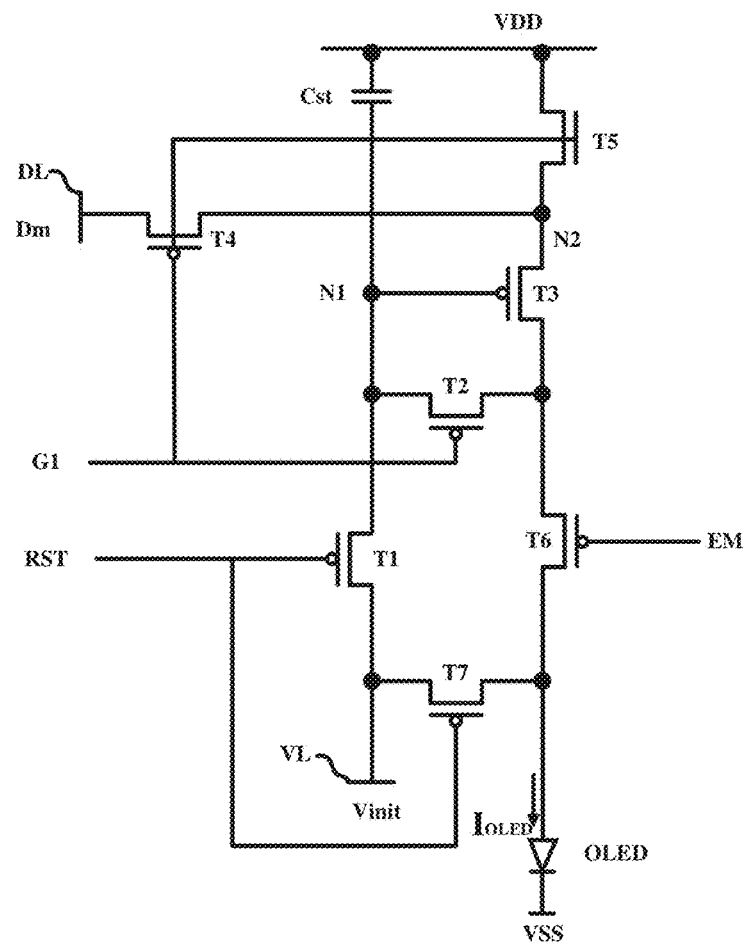
FIGS. 4A, 5A, 6A, and 7A are circuit diagrams of a specific implementation example of the pixel circuit shown in FIG. 3, respectively.

For example, the data writing circuit 200 is connected to the first terminal 110 (the second node N2) of the driving circuit 100 and a first scanning signal line G1, and is configured to write a data signal into the first terminal 110 of the driving circuit 100 in response to a first scanning signal provided by the first scanning signal line G1. For example, the data writing circuit 200 is connected to the data signal terminal Vdata (for example, as shown in FIG. 4A, the data signal terminal Vdata is connected to the data line DL), the second node N2, and the first scanning signal line G1. For example, the first scanning signal from the first scanning signal line G1 is applied to the data writing circuit 200 to control whether the data writing circuit 200 is turned on or not.

For example, in a data writing phase, the data writing circuit 200 can be turned on in response to the first scanning signal, so that the data writing circuit 200 can write the data signal into the first terminal 110 (the second node N2) of the driving circuit 100 and store the data signal in the compensation storage circuit 300, so as to generate the driving current for driving the light-emitting element 500 to emit light according to the data signal during, for example, the light-emitting phase.

For example, the compensation storage circuit 300 is connected to the control terminal 130 (the first node N1) and the second terminal 120 (the third node N3) of the driving circuit and is connected to the second scanning signal line G2 and the first power line VDD, and is configured to store the data signal written by the data writing circuit 200 in response to the second scanning signal provided by the second scanning line G2 and compensate the driving circuit 100. For example, the compensation storage circuit 300 may be connected to the second scanning signal line G2, the first power line VDD, the first node N1, and the third node N3. For example, the second scanning signal from the second scanning signal line G2 is applied to the compensation storage circuit 300 to control whether the compensation storage circuit 300 is turned on or not. For example, in the case where the compensation storage circuit 300 comprises a capacitor, for example, in the data writing and compensation phase, the compensation storage circuit 300 can be turned on in response to the second scanning signal, so that the data signal written by the data writing circuit 200 can be stored in the capacitor. For example, in the data writing and compensation phase, at the same time, the compensation storage circuit 300 can electrically connect the control terminal 130 of the driving circuit 100 to the second terminal 120 of the driving circuit 100, so that the relevant information of the threshold voltage of the driving circuit 100 can also be correspondingly stored in the capacitor, so that, for example, the stored data signal and the stored threshold voltage can be used to control the driving circuit 100 during the light-emitting phase, so that the output of the driving circuit 100 can be compensated.

For example, the first light-emitting control circuit 400 is connected to the first terminal 110 (the second node N2) of the driving circuit 100, the first power line VDD, and the first scanning signal line G1, and is configured to apply the first voltage of the first power line VDD to the first terminal 110 of the driving circuit 100 in response to the first scanning signal provided by the first scanning signal line G1. For example, as shown in FIG. 2, the first light-emitting control circuit 400 is connected to the first scanning signal line G1, the first power line VDD, and the second node N2.

For example, in the initialization phase, the first light-emitting control circuit 400 can be turned on in response to the first scanning signal, so that the first voltage VDD can be applied to the first terminal 110 of the driving circuit 100, so as to make the voltage of the second node N2 be the first voltage VDD, so as to keep the source voltage of the driving transistor at a stable potential during the initialization phase. Therefore, in the initialization phase, the gate voltage Vg and the source voltage Vs of the driving transistor of the driving circuit are reset at the same time, so that the driving transistor is in the On-Bias state, so that regardless of whether the data voltage of the image displayed in the previous frame is black or white, the driving transistor starts data writing and compensation from the On-Bias state, so the problem of short-term afterimage can be ameliorated.

For example, in the light-emitting phase, the first light-emitting control circuit 400 can be turned on in response to the first scanning signal, so that the first voltage VDD can be applied to the first terminal 110 of the driving circuit 100. When the driving circuit 100 is turned on, the driving circuit 100 can control the driving current flowing according to the data signal stored in the compensation storage circuit and apply the driving current to the light-emitting element 500 when the second light-emitting control circuit 600 is turned on, so as to drive the light-emitting element to emit light. For example, the first voltage VDD may be a high voltage (e.g., higher than the second voltage VSS).

For example, a conductive state of the data writing circuit 200 and a conductive state of the first light-emitting control circuit 400 under control of the first scanning signal are mutually exclusive. For example, the data writing transistor implemented in the data writing circuit 200 and the first light-emitting control transistor implemented in the first light-emitting control circuit 400 are of different types, such that when the data writing transistor is turned off in response to the first level of the first scanning signal, the first light-emitting control circuit 400 is turned on in response to the first level of the first scanning signal, and when the first light-emitting control circuit 400 is turned off in response to the second level of the first scanning signal, the data writing transistor is turned on in response to the second level of the first scanning signal, so that voltage control of the second node N2 is achieved by turning on the first light-emitting control circuit 400 during the initialization phase, thereby avoiding the occurrence of residual image phenomenon without adding additional transistors and control signals.

For example, in some examples, the data writing circuit 200 may comprise a P-type transistor and the first light-emitting control circuit 400 comprises an N-type transistor; or the data writing circuit 200 may comprise an N-type transistor and the first light-emitting control circuit 400 comprises a P-type transistor. For example, the N-type transistor and the P-type transistor have different turn-on voltages, for example, the P-type transistor is turned on in response to a low-level signal and the N-type transistor is turned on in response to a high-level signal (higher than the aforementioned low-level signal). Therefore, through this setting, voltage control of the second node N2 can be achieved by turning on the first light-emitting control circuit 400 during the initialization phase, thereby allowing the data writing circuit 200 and the first light-emitting control circuit 400 to share the gate signal, and voltage control of the second node N2 during the initialization stage can be achieved without adding additional transistors and gate signals.

For example, In other examples, each of the compensation storage circuit 300 and the data writing circuit 200 may comprise a P-type transistor, and the first light-emitting control circuit 400 comprises an N-type transistor; or each of the compensation storage circuit 300 and the data writing circuit 200 may comprise an N-type transistor, and the first light-emitting control circuit 400 comprises a P-type transistor. For example, the N-type transistor and the P-type transistor have different turn-on voltages, e.g., the P-type transistor is turned on in response to a low-level signal and the N-type transistor is turned on in response to a high-level signal (higher than the aforementioned low-level signal). Therefore, through this setting, voltage control of the second node N2 can be achieved by turning on the first light-emitting control circuit 400 during the initialization phase, thereby enabling the compensation storage circuit 300, the data writing circuit 200, and the first light-emitting control circuit 400 to share the gate signal, and voltage control of the second node N2 during the initialization phase can be achieved without adding additional transistors and gate signals.

For example, when an N-type transistor is used, IGZO (Indium Gallium Zinc Oxide) can be used as the active layer of the thin film transistor, compared to using LTPS (Low Temperature Poly Silicon) or amorphous silicon (e.g., hydrogenated amorphous silicon) as the active layer of the thin film transistor, the size of the transistor can be effectively reduced and the leakage current can be prevented, so that the resolution of the display panel can be increased while making the pixel circuit applicable to low-frequency driving, and the following embodiments are the same as those described herein and will not be repeated.

For example, the second light-emitting control circuit 600 is connected to the light-emitting control signal line EM, the first terminal 510 of the light-emitting element 500, and the second terminal 120 of the driving circuit 100, and is configured to apply a driving current to the light-emitting element 500 in response to the light-emitting control signal provided by the light-emitting control signal line EM.

For example, in the light-emitting phase, the second light-emitting control circuit 600 is turned on in response to the light-emitting control signal provided by the light-emitting control signal line EM, so that the driving circuit 100 can apply the driving current to the light-emitting element 500 through the second light-emitting control circuit 600 to make the light-emitting element 500 to emit light; and in the non-light-emitting phase, the second light-emitting control circuit 600 is turned off in response to the light-emitting control signal, thereby preventing a current from flowing through the light-emitting element 500 and causing the light-emitting element 500 to emit light, so as to improve the contrast of the corresponding display device.

For example, the first scanning signal and the light-emitting control signal are turn-on signals simultaneously for at least part of the time period, for example, during the light-emitting phase, the first scan scanning and the light-emitting control signal can be turn-on signals simultaneously to cause the first light-emitting control circuit 400 and the second light-emitting control circuit 600 to be turned on simultaneously during the light-emitting phase to enable the light-emitting element 500 to emit light.

For example, the light-emitting element 500 comprises a first terminal 510 and a second terminal 520, the first terminal 510 of the light-emitting element 500 is configured to receive the driving current from the second terminal 120 of the driving circuit 100 through the second light-emitting control circuit 600, and the second terminal 520 of the light-emitting element 500 is configured to be connected to a second power line VSS. For example, in the example shown in FIG. 2, in the case where the pixel circuit 10 comprises the second light-emitting control circuit 600, the first terminal 510 of the light-emitting element 500 may also be connected to the fourth node N4 and is connected to the third node N3 through the second light-emitting control circuit 600. Embodiments of the present disclosure comprise, but are not limited to, this scenario.

Figure 3:
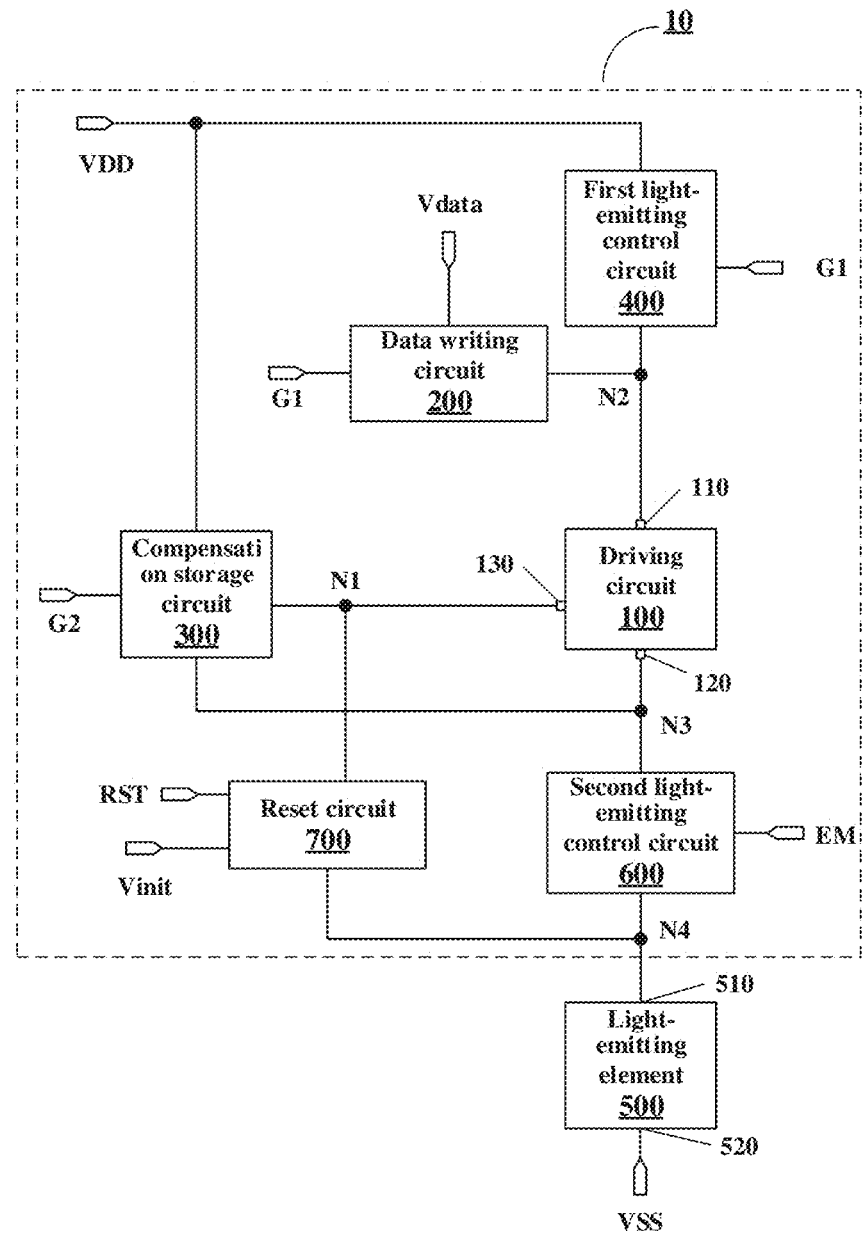
FIG. 3 is a schematic block diagram of another pixel circuit provided in at least one embodiment of the present disclosure.

For example, as shown in FIG. 3, based on the example shown in FIG. 2, the pixel circuit 10 also comprises a reset circuit 700.

For example, the reset circuit 700 is connected to an initial voltage terminal Vinit, the first terminal 510 of the light-emitting element 500, and the control terminal 130 (the first node N1) of the driving circuit 100, and is configured to apply the reset voltage provided by the initial voltage terminal Vinit to the first terminal 510 of the light-emitting element 500 and the control terminal 130 (the first node N1) of the driving circuit 100 in response to the reset signal. For example, as shown in FIG. 3, the reset circuit 700 is connected to the fourth node N4, the first node N1, the initial voltage terminal Vinit, the first terminal 510 of the light-emitting element 500, and a reset control terminal RST (a reset control line), respectively. For example, during the initialization phase, the reset circuit 700 can be turned on in response to the reset signal, so that the reset voltage can be applied to the first terminal 510 (the fourth node N4) of the light-emitting element 500 and the control terminal 130 (the first node N1) of the driving circuit 100, so that a reset operation can be performed on the driving circuit 100, the compensation storage circuit 300, and the light-emitting element 500, thus eliminating the effect of the previous light-emitting phase.

The pixel circuit provided in at least one embodiment of the present disclosure can solve the residual image problem without increasing transistors and control signal lines, facilitating the implementation and layout of the pixel circuit and facilitating the promotion of the product.

For example, in the case where the driving circuit 100 is implemented as a driving transistor, for example, a gate electrode of the driving transistor may be used as the control terminal 130 of the driving circuit 100 (connected to the first node N1), a first electrode (e.g., source electrode) may be used as the first terminal 110 of the driving circuit 100 (connected to the second node N2), and the second electrode (e.g., drain electrode) may be used as the second terminal 120 of the driving circuit 100 (connected to the third node N3).

It is to be noted that the first power line VDD in the embodiment of the present disclosure, for example, maintains to input the DC high level signal, and the DC high level signal is referred to as the first voltage; the second power line VSS, for example, maintains to input the DC low level signal, and the DC low level signal is referred to as the second voltage, which is lower than the first voltage. The following embodiments are the same as those described herein and will not be repeated.

It should be noted that in the description of this disclosed embodiment, the first node N1, the second node N2, the third node N3, and the fourth node N4 do not denote actual existing components, but rather indicate the convergence points of the relevant circuit connections in the circuit diagram.

It should be noted that in the description of embodiments of the present disclosure, the symbol Vdata can indicate both the data signal terminal and the level of the data signal, similarly, the symbol Vinit can indicate both the initial voltage terminal and the reset voltage, the symbol VDD can indicate both the first power line and the first voltage, and the symbol VSS can indicate both the second power line and the second voltage. The following embodiments are the same as those described herein and will not be repeated.

For example, the initial voltage terminal Vinit is connected to an initial voltage line VL to receive the reset voltage.

For example, the pixel circuit 10 shown in FIG. 3 can be specifically implemented as the pixel circuit structure shown in FIG. 4A. As shown in FIG. 4A, the pixel circuit 10 comprises: transistors T1, T2, T3, T4, T5, T6, a storage capacitor Cst, and a light-emitting element OLED. For example, the transistor T1 is used as a driving transistor and the other transistors T2-T7 are used as switching transistors. For example, the light-emitting element OLED may be various types of OLEDs, such as top-emitting, bottom-emitting, dual side emitting, etc., and may emit red, green, blue, or white light, etc., and the embodiments of the present disclosure are not limited thereto.

For example, as shown in FIG. 4A, in more detail, the driving circuit 100 may be implemented as a driving transistor T3. A gate electrode of the driving transistor T3 serves as the control terminal 130 of the driving circuit 100 and is connected to the first node N1; a first electrode of the driving transistor T3 serves as the first terminal 110 of the driving circuit 100 and is connected to the second node N2; a second electrode of the driving transistor T3 serves as the second terminal 120 of the driving circuit 100 and is connected to the third node N3. For example, the driving transistor T3 is a P-type transistor. For example, the P-type transistor is turned on in response to a low-level signal, and the following embodiments are the same as those described herein and will not be repeated. It should be noted that, the present disclosure is not limited thereto, the driving circuit 100 may also be a circuit comprising other components.

The data writing circuit 200 may be implemented as a data writing transistor T4. A gate electrode of the data writing transistor T4 is connected to the first scanning signal line G1 to receive the first scanning signal, and a first electrode of the data writing transistor T4 is connected to the data line DL (connected to the data signal terminal Vdata) to receive the data signal, and a second electrode of the data writing transistor T4 is connected to the first terminal 110 (the second node N2) of the driving circuit 100.

The compensation storage circuit 300 may be implemented as a compensation transistor T2 and a storage capacitor Cst. A gate electrode of the compensation transistor T2 is configured to be connected to the second scanning signal line G2 to receive the scanning signal, a first electrode of the compensation transistor T2 is connected to the control terminal 130 (first node N1) of the driving circuit 100, and a second electrode of the compensation transistor T2 is connected to the second terminal 120 (third node N3) of the driving circuit 100; a first electrode of the storage capacitor Cst is connected to the control terminal 130 of the driving circuit 100, and a second electrode of the storage capacitor Cst is connected to the first power line VDD.

The first light-emitting control circuit 400 may be implemented as a first light-emitting control transistor T5. A gate electrode of the first light-emitting control transistor T5 is connected to the first scanning signal line G1 to receive the first light-emitting control signal, a first electrode of the first light-emitting control transistor T5 is connected to the first power line VDD to receive the first voltage, and a second electrode of the first light-emitting control transistor T5 is connected to the first terminal 110 (second node N2) of the driving transistor.

The second light-emitting control circuit 600 may be implemented as a second light-emitting control transistor T6. A gate electrode of the second light-emitting control transistor T6 is connected to the second light-emitting control line (light-emitting control signal line EM) to receive the light-emitting control signal, a first electrode of the second light-emitting control transistor T6 is connected to the second terminal 120 (third node N3) of the driving circuit 100, and a second electrode of the second light-emitting control transistor T6 is connected to the first terminal 510 (fourth node N4) of the light-emitting element OLED.

The first terminal 510 (here, the anode) of the light-emitting element OLED is connected to the fourth node N4 and is configured to receive the driving current from the second terminal 120 of the driving circuit 100 through the second light-emitting control circuit 600, and the second terminal 520 (here, the cathode) of the light-emitting element OLED is configured to be connected to the second power line VSS to receive the second voltage. For example, the second power line can be grounded, that is, VSS can be 0V.

The reset circuit 400 may be implemented as a first reset transistor T1 and a second reset transistor T7. A gate electrode of the first reset transistor T1 is configured to be connected to the first reset signal line RST to receive the first reset signal as a reset signal, a first electrode of the first reset transistor T1 is connected to the initial voltage terminal Vinit to receive the reset voltage, and a second electrode of the first reset transistor T1 is configured to be connected to the control terminal 130 of the driving circuit 100.

A gate electrode of the second reset transistor T7 is connected to the second reset signal line RST to receive the second reset signal as a reset signal, a first electrode of the second reset transistor T7 is connected to the initial voltage terminal Vinit to receive the reset voltage, and a second electrode of the second reset transistor T7 is connected to the first terminal 510 of the light-emitting element 500.

For example, in some examples, the type of the data writing transistor T4 and the type of the first light-emitting control transistor T5 are different.

For example, in the example shown in FIG. 4A, the data writing transistor T4 is a P-type transistor, such as a thin film transistor in which the active layer is low-temperature doped polysilicon. The first light-emitting control transistor T5 is an N-type transistor. For example, when an N-type transistor is adopted, IGZO can be used as the active layer of the thin film transistor to reduce the size of the driving transistor and prevent leakage current. For example, the N-type transistor is turned on in response to a high-level signal, and the following embodiments are the same as those described herein and will not be repeated again. For example, the first reset transistor T1, the second reset transistor T7, the compensation transistor T2, and the second light-emitting control transistor T6 are all P-type transistors, such as thin film transistors in which active layers are low-temperature doped polysilicon.

Figure 5A:
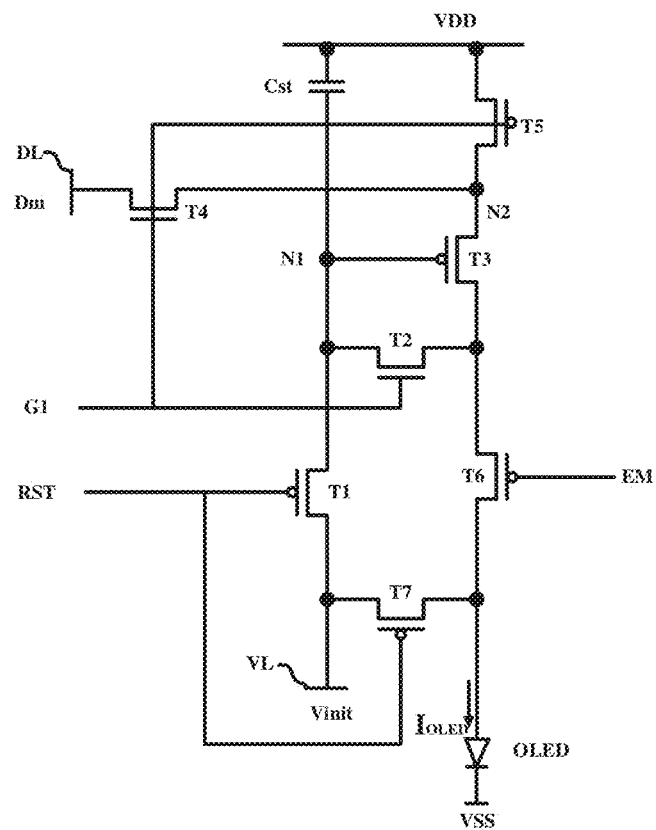

For example, in the example shown in FIG. 5A, both the data writing transistor T4 and the compensation transistor T2 are N-type transistors, and the first light-emitting control transistor T5 is a P-type transistor. For example, the first reset transistor T1, the second reset transistor T7, and the second light-emitting control transistor T6 are all P-type transistors.

Figure 6A:
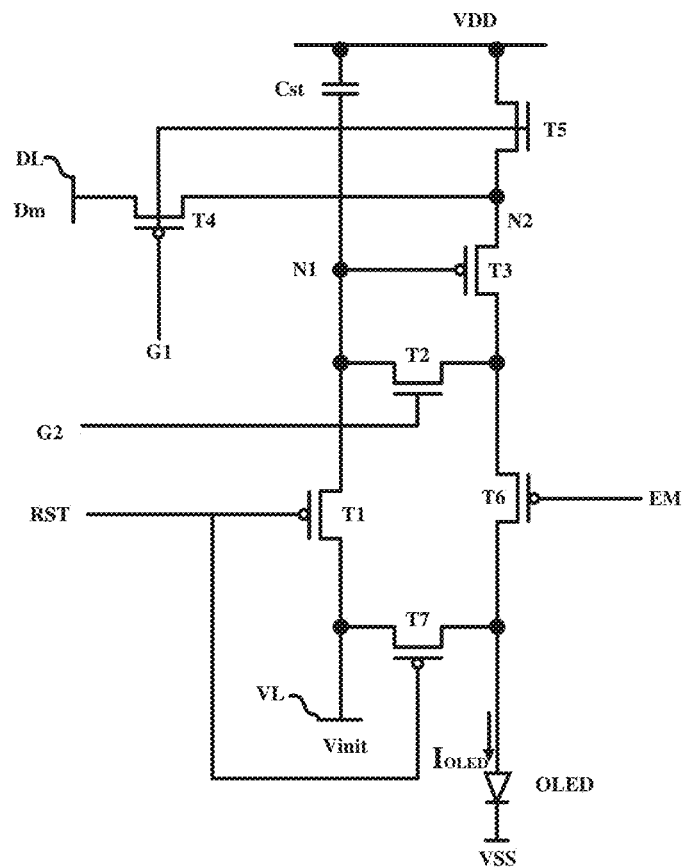

For example, in the example shown in FIG. 6A, the data writing transistor T4 is a P-type transistor, and the first light-emitting control transistor T5 and the compensation transistor T2 are both N-type transistors. For example, the first reset transistor T1, the second reset transistor T7, and the second light-emitting control transistor T6 are all P-type transistors.

Figure 7A:
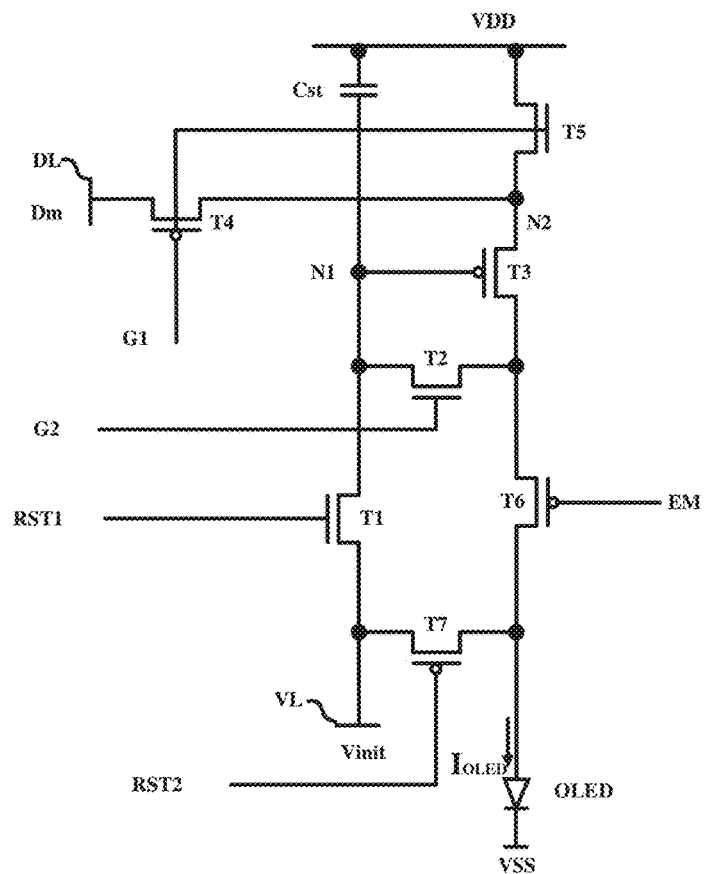

For example, in the example shown in FIG. 7A, the data writing transistor T4 is a P-type transistor, and the first reset transistor T1, the first light-emitting control transistor T5, and the compensation transistor T2 are all N-type transistors. For example, both the second reset transistor T7 and the second light-emitting control transistor T6 are P-type transistors.

For example, the width-to-length ratio of the N-type transistor in each of the above embodiments may be 2.5/3.5, for example, its width ranges from 1.5 µm to 4 µm (micrometer), for example, the width may be 1.5, 2, 2.5, 3, 3.5, 4, etc., the length ranges from 3 µm to 5 µm, for example, the length can be 3, 3.5, 4, 4.5, 5, etc.; the width-to-length ratio of the P-type transistor can be 2.2/3.0 (except for the driving transistor), for example, its width ranges from 1.5 µm to 4 µm, for example, the width can be 1.5, 2, 2.5, 3, 3.5, 4, etc., the length ranges from 2 µm to 6 µm, for example, the length can be 2, 3, 4, 5, 6, etc., the embodiments of the present disclosure are not limited in this regard.

As shown in FIGS. 12 and 14, the pixel circuit needs to turn on the driving transistor T3 during the data writing and compensation phase, therefore, the voltage difference Vinit-VDD between the initial signal terminal Vinit and the first power line VDD needs to be smaller than the threshold voltage Vth of the driving transistor T3, where Vinit is the voltage of the initial signal terminal, and VDD is the voltage of the first power line VDD. Vinit can be −2~−6V (volts), for example, −2V, −3V, −4V, −5V, −6V, and so on. Vinit-VDD can be less than a*Vth, a can be 2~7, for example, a can be 2, 4, 6, 7; Vth can be −2~−5V, for example −2V, −3V, −5V, and so on. VDD may be greater than 1.5 times Vth, for example, VDD may be 1.6 times, 1.8 times, 2 times, etc., of Vth.

The display panel may include a plurality of array-distributed pixel driving circuits P, and the plurality of first power lines VDD may all be used to provide the first voltage. A part of the first power lines VDD extends along a column direction, and the other part of the first power lines VDD extends along a row direction. Pixel circuits in two adjacent rows can be connected to the first power line extending in the same row direction, and the first power line VDD can be located between the two adjacent rows of pixel circuits as described above. The first power lines extending along the column direction can be connected to a plurality of first power lines, which intersect with the first power lines extending along the column direction, extending along the row direction, so that the plurality of power lines can form a grid structure. The first power lines extending along the column direction may be located in the region where the red pixel circuits are located. In addition, in the same pixel row, two pixel circuits in adjacent columns can be mirrored to facilitate wiring.

For example, when the first reset signal and the second reset signal are different, for example, the absolute value of the second reset signal is greater than 1.5 times the threshold voltage of the driving circuit. In some exemplary embodiments, the magnitude of the second reset signal is greater than zero. Exemplarily, the second reset signal is generally a reset voltage of 4~10V, and the first reset signal is generally a reset voltage of −2V~−6V.

For example, the voltage value of the first voltage may be greater than 0V and less than or equal to 5V, for example, the voltage value of the first voltage may be 4.6V, but the present disclosure is not limited thereto. For example, the reset voltage can be a DC voltage, and the voltage value of the reset voltage can be greater than or equal to −7V and less than or equal to 0V; for example, the voltage value of the reset voltage can be −6V, −5V, −4V, −3V, or −2V, but the present disclosure is not limited to these case.

In at least one embodiment of the present disclosure, the threshold voltage Vth of the driving transistor in the driving circuit may be greater than or equal to −5V and less than or equal to −2V, for example, Vth may be greater than or equal to −4V and less than or equal to −2.5V; for example, Vth can be −4V, −3.5V, −3V, or −2.5V, but the present disclosure is not limited thereto.

For example, the absolute value of the voltage value of the reset signal can be greater than 1.5 times the absolute value of the threshold voltage to ensure that the bias effect can be quickly achieved in a short period of time. For example, the absolute value of the voltage value of the reset signal may be greater than 2 times, 2.5 times, or 3 times the absolute value of the threshold voltage, but the present disclosure is not limited to these case.

The channel width W of the second reset transistor T7 is 1.5–3.5, such as 1.6, 1.8, 1.9, 2.0, 2.2, 2.5, 3.0, etc.; the channel length L is 2.0–4.5; for example, it may be 2.5, 2.7, 3.0, 3.2, 3.5, 4.0, etc.

The width-to-length ratio W/L of the first light-emitting control transistor T8 may be greater than the width-to-length ratio W/L of the first reset transistor T1, so that the reset capability of the N2 node can be improved.

In the embodiment of the present disclosure, the channel width W of the first light-emitting control transistor T8 is 1.5–3.5, for example, the channel width W of the first light-emitting control transistor T8 can be 1.6, 1.8, 1.9, 2.0, 2.2, 2.5, 3.0, etc.; the channel length L of the first light-emitting control transistor T8 is 2.0–4.5; for example, the channel length L of the first light-emitting control transistor T8 can be 2.5, 2.7, 3.0, 3.2, 3.5, 4.0, etc.; the channel width W of the first reset transistor T1 is 1.5–3.5, for example, the channel width W of the first reset transistor T1 can be 1.6, 1.8, 1.9, 2.0, 2.2, 2.5, 3.0, etc.; the channel length L of the first reset transistor T1 is 2.0–4.5; for example, the channel length L of the first reset transistor T1 can be 2.5, 2.7, 3.0, 3.2, 3.5, 4.0, and so on.

Figure 4B:
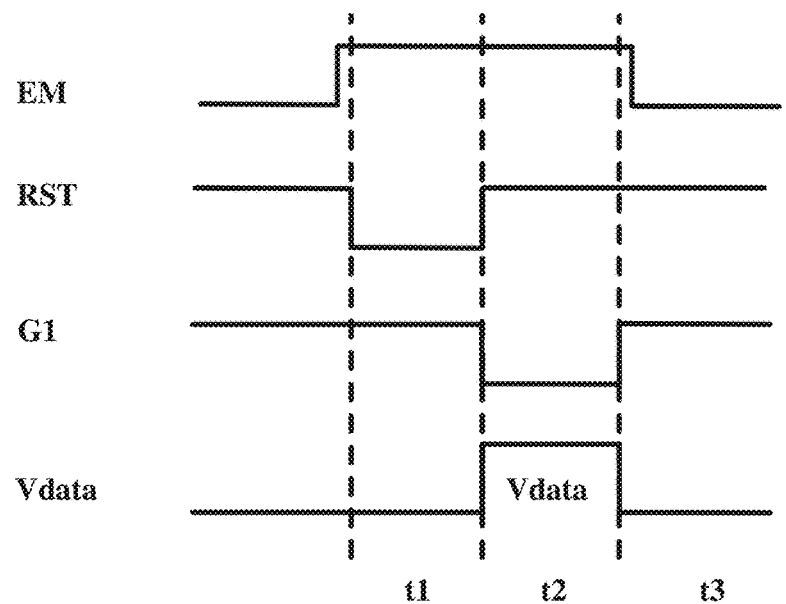
FIGS. 4B, 5B, 6B, and 7B are timing diagrams of driving methods of the pixel circuits shown in FIGS. 4A, 5A, 6A, and 7A, respectively.

The working principle of the pixel circuit 10 shown in FIG. 4A is explained below in conjunction with the signal timing diagram shown in FIG. 4B.

As shown in FIG. 4A, the display process of each frame of image comprises three phases, which are an initialization phase t1, a data writing and compensation phase t2, and a light-emitting phase t3, and the figure shows the timing waveforms of respective signals in each phase.

Figure 8A:
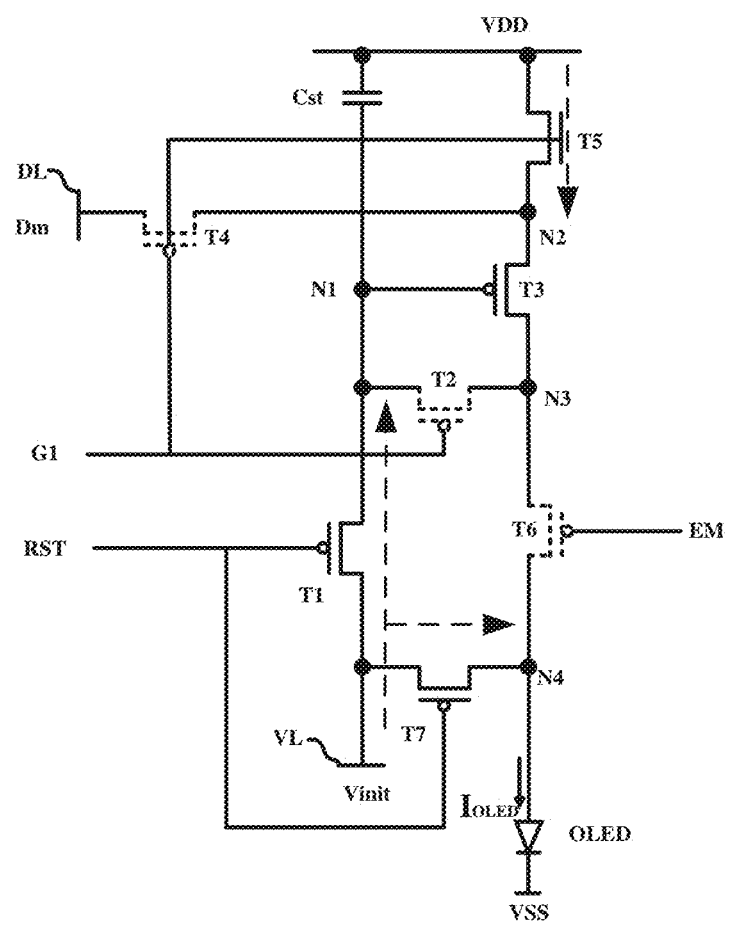
FIGS. 8A to 8C are schematic diagrams of the pixel circuit shown in FIG. 4A corresponding to the three phases in FIG. 4B, respectively.
Figure 8B:
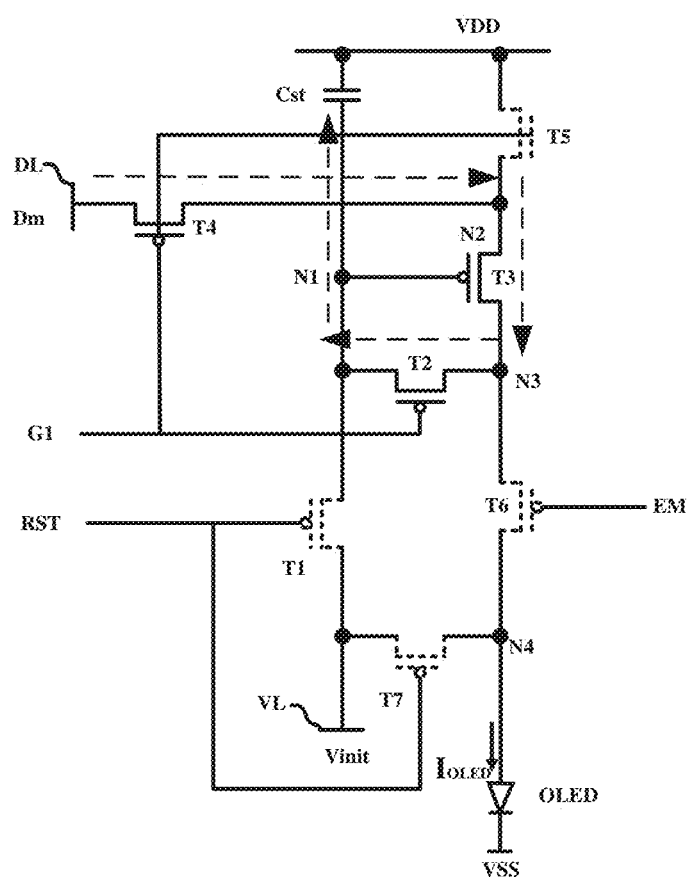
Figure 8C:
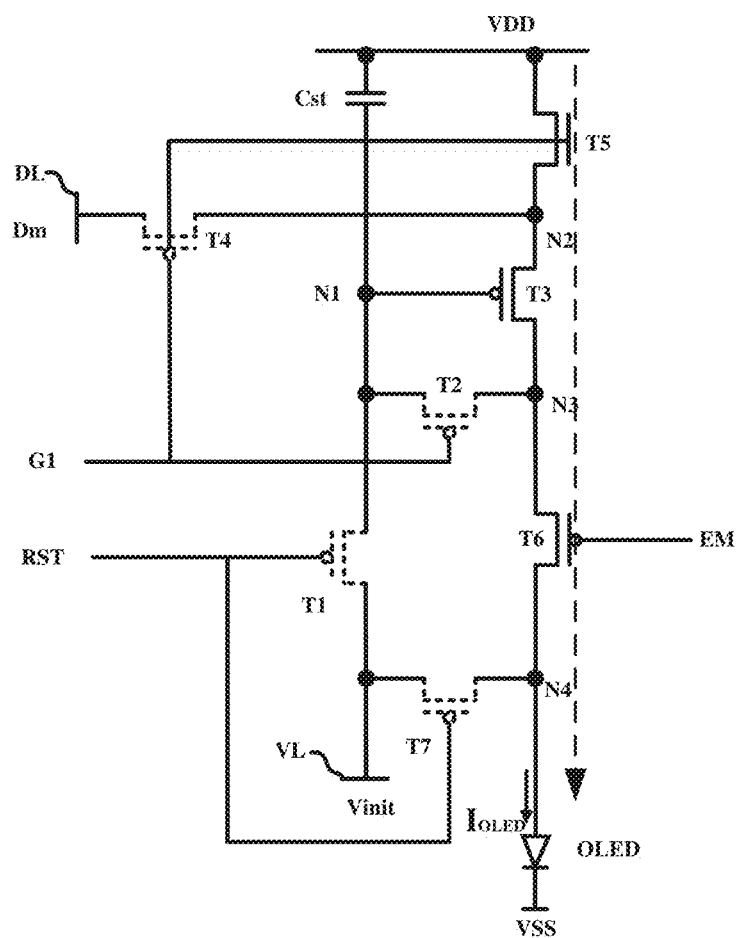

It should be noted that FIG. 8A is a schematic diagram when the pixel circuit shown in FIG. 4A is in the initialization phase t1, FIG. 8B is a schematic diagram when the pixel circuit shown in FIG. 4A is in the data writing and compensation phase t2, and FIG. 8C is a schematic diagram of the pixel circuit shown in FIG. 4A is in the light-emitting phase t3. In addition, the transistors marked with dotted lines in FIG. 8A to FIG. 8C all indicate that they are in a turn-off state in the corresponding phase, and the dotted lines with arrows in FIG. 8A to FIG. 8C indicate the current direction of the pixel circuit in the corresponding phase. The transistors shown in FIG. 8A to FIG. 8C are all described by taking a case that the driving transistor T3 and the first reset transistor T1 are N-type transistors and the other transistors are P-type transistors as an example, that is, each N-type transistor is turned on when the gate electrode of each N-type transistor receives a high voltage, and each N-type transistor is turned off when the gate electrode of each N-type transistor receives a low voltage; each P-type transistor is turned on when the gate electrode of each P-type transistor receives a low voltage, and each P-type transistor is turned off when the gate electrode of each P-type transistor receives a high voltage. The following embodiments are the same as those described herein and will not be repeated again.

In the initialization phase t1, the first level (for example, the low level shown in FIG. 5) of the first scanning signal is input through the first scanning signal line to turn on the first light-emitting control circuit 400, the first voltage VDD is applied to the first terminal of the driving circuit 100 through the turned-on first light-emitting control circuit 400; the reset signal is input to turn on the reset circuit 700, and the reset voltage is applied to the first terminal of the light-emitting element OLED and the control terminal 130 of the driving circuit 100 through the turned-on reset circuit 700.

As shown in FIG. 8A, in the initialization phase t1, because the first reset transistor T1 and the second reset transistor T7 are P-type transistors and the first light-emitting control transistor T5 is an N-type transistor, the first reset transistor T1 and the second reset transistor T7 are turned on by the low level of the reset signal, the first light-emitting control transistor T5 is turned on by the low level of the first scanning signal; at the same time, the compensation transistor T2 and the data writing transistor T4 are turned off by the high level of the first scanning signal, and the second light-emitting control transistor T6 is turned off by the high level of the light-emitting control signal.

As shown in FIG. 5, in the initialization phase t1, a reset path of the first node N1 and the fourth node N4 (as shown by the dotted line with an arrow in FIG. 8A) and a reset path of the second node N2 (as shown by the dotted line with an arrow in FIG. 8A) are formed. Therefore, in this phase, the storage capacitor Cst and the gate electrode of the driving transistor T3 are discharged through the first reset transistor T1, the driving transistor T3 and the light-emitting element OLED are discharged through the second reset transistor T7, and the light-emitting element OLED is discharged through the second reset transistor T7, thus resetting the first node N1 and the light-emitting element OLED (that is, the fourth node N4). The voltage of the second node N2 is charged through the first light-emitting control transistor T5, thereby stabilizing the voltage of the second node N2 at a stable voltage. Therefore, after the initialization phase t1, the potentials of the first node N1, the third node N3, and the fourth node N4 are the reset voltage Vinit (a low-level signal, such as grounding or other low-level signals), and the potential of the second node is the first voltage VDD. In this phase, because the driving transistor T3 and the first light-emitting control transistor T5 are turned on, the second node N2 maintains a stable potential, the Vg and Vs voltages of the driving transistor are reset at the same time, so that the driving transistor is in a fixed bias on state (that is, the On-Bias state), therefore, no matter whether the data voltage of the previous frame display image is black or white, the driving transistor starts from the On-Bias state to perform the writing and compensate phase t2 of the current frame data voltage, which can ameliorate the short-term afterimage problem.

After the initialization period t1, the potential of the first node N1 is the reset voltage Vinit, and the potential of the second node N2 is VDD. In the initialization period t1, the storage capacitor Cst is reset to discharge the voltage stored in the storage capacitor Cst, so that the data signal in the subsequent phase can be stored in the storage capacitor Cst more quickly and reliably; at the same time, the light-emitting element OLED (that is, the fourth node N4) is also reset, so that the light-emitting element OLED can display in a black state and do not emit light before the light-emitting phase t3, and the display effect such as the contrast ratio of the display device using the above-mentioned pixel circuit can be ameliorated.

In the data writing and compensation phase t2, the second level of the first scanning signal is input through the first scanning signal line G1 to turn on the data writing circuit 200, the second scanning signal is input through the second scanning signal line G2 to turn on the compensation storage circuit 300, the data signals are input through the data lines DL~Dm, the data signal is written into the first terminal 110 of the driving circuit 100 through the data writing circuit 200 that is turned on to turn on the driving circuit 100, and the data signal is stored through the turned-on compensation storage circuit 300, and the driving circuit 100 is compensated through the turned-on compensation storage circuit 300.

As shown in FIG. 4A and FIG. 8B, in the data writing and compensation phase t2, the data writing transistor T4 is turned on by the second level of the first scanning signal (for example, the high level shown in FIG. 5B), and the compensation transistor T2 is turned on by the high level of the second scanning signal (in this example, the first scanning signal and the second scanning signal are the same signal), and at the same time, the first light-emitting control transistor T5 is turned off by the high level of the first scanning signal, the second light-emitting control transistor T6 is turned off by the high level of the light-emitting control signal, and the first reset transistor T1 and the second reset transistor T7 are turned off by the high level of the reset signal.

As shown in FIG. 8B, in the data writing and compensation phase t2, a data writing and compensation path is formed (as shown by the dotted line with an arrow in FIG. 8B), and the data signal passes through the data writing transistor T4, the driving transistor T3, and the compensation transistor T2 and then charges the first node N1 (that is, charges the storage capacitor Cst), that is to say, the potential of the first node N1 increases. It is easy to understand that the potential of the second node N2 remains at Vdata, and according to the characteristics of the driving transistor T3 itself, when the potential of the first node N1 increases to Vdata+Vth, the driving transistor T3 is turned off, and the charging process ends. It should be noted that Vdata represents the voltage value of the data signal, and Vth represents the threshold voltage of the first transistor. Because in this embodiment, the driving transistor T3 is described using a P-type transistor as an example, the threshold voltage Vth here can be is a negative value.

After the data writing phase 2, the potentials of the first node N1 and the third node N3 are both Vdata+Vth, that is to say, the voltage information with the data signal and the threshold voltage Vth is stored in the storage capacitor Cst to provide grayscale display data and compensate the threshold voltage of the driving transistor T3 itself during the subsequent light-emitting phase.

In the light-emitting phase t3, the first scanning signal is input through the first scanning signal line G1 to turn on the first light-emitting control circuit 400 and the driving circuit 100, and the light-emitting control signal is input through the light-emitting control signal line EM to turn on the second light-emitting control circuit 600. A driving current is applied to the light-emitting element 500 to enable the light-emitting element 500 to emit light through the turned-on first light-emitting control circuit 400, the turned-on driving circuit 100, and the turned-on second light-emitting control circuit 600.

As shown in FIG. 4A and FIG. 8C, in the light-emitting phase t3, the first light-emitting control transistor T5 is turned on by the high level of the first scanning signal, and the second light-emitting control transistor T6 is turned on by the low level of the light-emitting control signal; at the same time, the data writing transistor T4 is turned off by the high level of the first scanning signal, the compensation transistor T2 is turned off by the high level of the second scanning signal (i.e., the first scanning signal), and the first reset transistor T1 and the second reset transistor T7 are turned off by the low level of the reset signal. At the same time, the potential of the first node N1 is Vdata+Vth, and the potential of the second node N2 is VDD, so that the driving transistor T3 is also kept turned on in this phase.

As shown in FIG. 8C, in the light-emitting phase t3, a driving light-emitting path is formed (shown by the dotted line with an arrow in FIG. 8C). The light-emitting element OLED can emit light under the action of the driving current flowing through the driving transistor T3.

Specifically, the value of the driving current $I_{L1}$ flowing through the light-emitting element OLED can be obtained according to the following formula:

$$IL1 = K(V_{GS} - Vth)^2$$
$$= K[(Vdata + Vth - VDD) - Vth]^2$$
$$= K(Vdata - VDD)^2$$

where $K=W*Cox*U/L$.

In the above formula, Vth represents the threshold voltage of the driving transistor T3, $V_{GS}$ represents the voltage between the gate electrode and the source electrode (here, the first electrode) of the driving transistor T3, and K is a constant value related to the driving transistor itself. From the calculation formula of $I_{L1}$ above, it can be seen that the driving current $I_{L1}$ flowing through the light-emitting element OLED is no longer related to the threshold voltage Vth of the driving transistor T3, thus the compensation for the pixel circuit can be implemented, and the problem of the driving transistor (in In the embodiment of the present disclosure, the problem of threshold voltage drift of the driving transistor (the driving transistor T3 in the embodiment of the present disclosure) due to the manufacturing process and long-term operation is solved, and the influence of threshold voltage drift on the driving current $I_{L1}$ is eliminated so that the display effect of the display device adopting the pixel circuit can be ameliorated.

It should be noted that the transistors used in the embodiments of the present disclosure may be thin film transistors or field effect transistors or other switching devices with the same characteristics, and the embodiments of the present disclosure are described by taking thin film transistors as examples. The source electrode and the drain electrode of the transistor used here may be symmetrical in structure, so there may be no difference in structure between the source electrode and the drain electrode. In the embodiments of the present disclosure, in order to distinguish the two electrodes of the transistor except the gate electrode, it is directly described that one of the two electrodes is the first electrode and the other of the two electrodes is the second electrode.

In addition, it should be noted that, the transistors in the pixel circuit 10 shown in FIG. 4 are illustrated by taking a case that the first light-emitting control transistor T5 is an N-type transistor and the other transistors are P-type transistors, in this case, the first electrode may be a drain electrode, and the second electrode may be a second electrode. As shown in FIG. 5, the cathode of the light-emitting element OLED in the pixel circuit 10 is connected to the second power line VSS to receive the second voltage. For example, in a display panel, when the pixel circuits 10 shown in FIG. 5 are arranged in an array, the cathodes of the light-emitting elements OLED can be electrically connected to the same voltage terminal, that is, a common cathode connection mode is adopted.

For example, the first scanning signal line and the second scanning signal line are the same or different, and the first scanning signal and the second scanning signal are the same or different.

For example, in the examples shown in FIG. 4A and FIG. 5A, the first scanning signal line and the second scanning signal line are the same, and both are denoted as G1, and correspondingly, the first scanning signal and the second scanning signal are the same.

For example, in the example shown in FIG. 6A and FIG. 7A, when the first scanning signal and the second scanning signal are different, the type of the data writing transistor T4 is different from the type of the compensation transistor T2, and the type of the compensation transistor T2 is the same as the type of the first light-emitting control transistor T5, for example, the data writing transistor T4 is a P-type transistor, and the compensation transistor T2 and the first light-emitting control transistor T5 are N-type transistors.

For example, the first reset signal line and the second reset signal line are the same or different, and the first reset signal and the second reset signal are the same or different.

For example, in the examples shown in FIGS. 4A, 5A, and 6A, the first reset transistor T1 and the second reset transistor T7 are of the same type, for example, both are P-type transistors, and the first reset signal line and the second reset signal line are the same, both are represented as RST, and correspondingly, the first reset signal and the second reset signal are also the same.

Figure 7B:
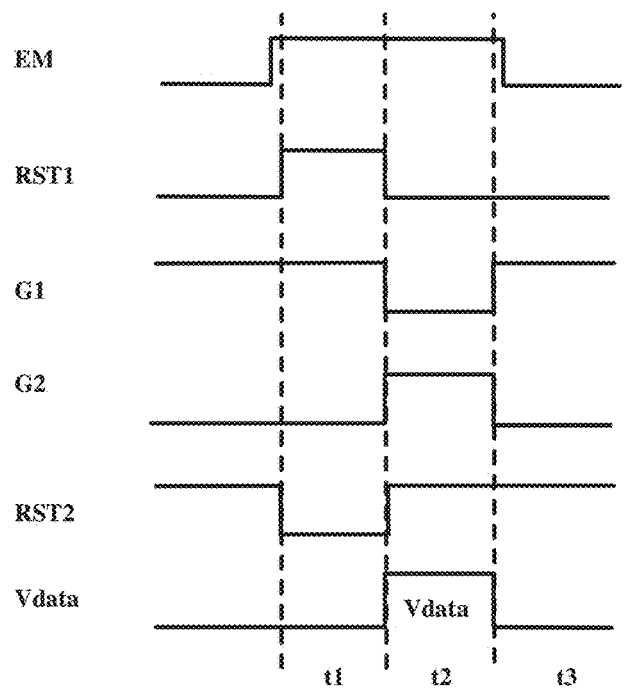

For example, in the example shown in FIG. 7A, the type of the first reset transistor T1 and the type of the second reset transistor T7 are different, for example, the first reset transistor T1 is an N-type transistor, and the second reset transistor T7 is a P-type transistor. The first reset signal line RST1 is different from the second reset signal line RST2, for example, as shown in FIG. 7B, the first reset signal and the second reset signal are opposite signals.

Figure 5B:
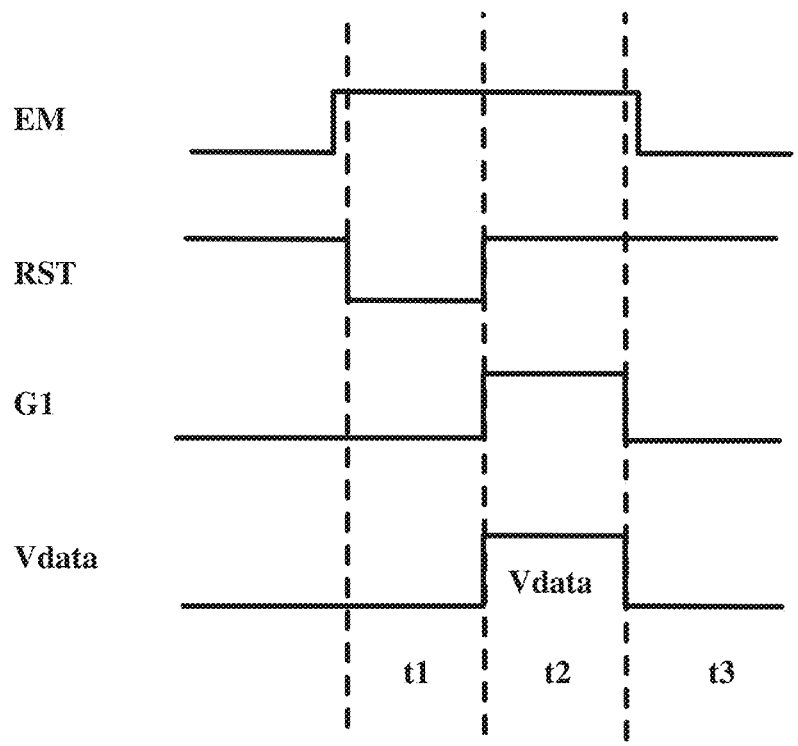
Figure 6B:
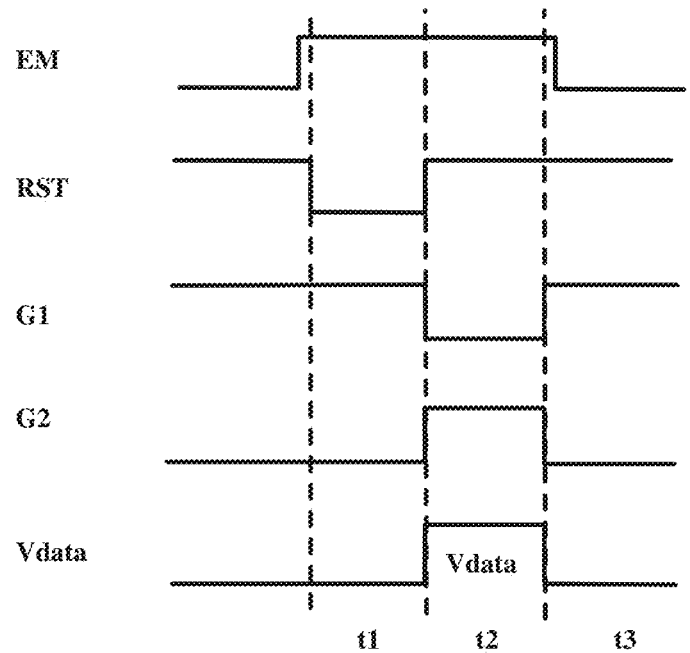

FIG. 5B is a working timing diagram of the pixel circuit shown in FIG. 5A; FIG. 6B is a working timing diagram of the pixel circuit shown in FIG. 6A, FIG. 7B is a working timing diagram of the pixel circuit shown in FIG. 7A, and the working timing diagrams of the pixel circuits shown in FIG. 5A, FIG. 6A, and FIG. 7A are similar to the working process of the pixel circuit shown in FIG. 4A, only corresponding adjustments have been made to the timing based on the transistor type. For details, please refer to the introduction of the working process of the pixel circuit shown in FIG. 4A, and repeated parts will not be repeated here.

In the above-mentioned embodiments of the present disclosure, the first light-emitting control transistor T5 is used to implement to control the voltage of the second node N2 in the initialization phase, so that the voltage of the second node N2 can maintain a stable potential in the initialization phase, thereby ameliorating the problem of short-term residual images without adding additional transistors.

Figure 9A:
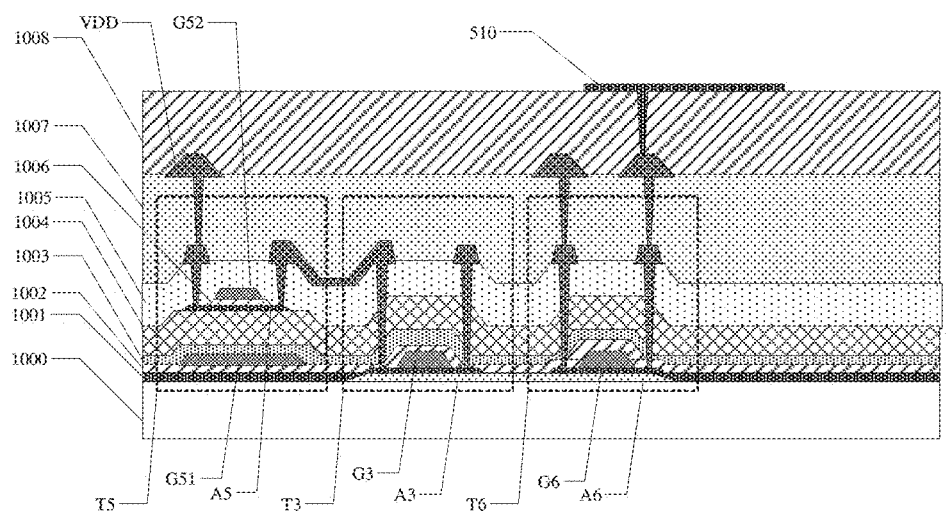
FIG. 9A is a cross-sectional view of a first light-emitting control transistor, a driving transistor, and a second light-emitting control transistor in the pixel circuit shown in FIG. 4A.
Figure 9B:
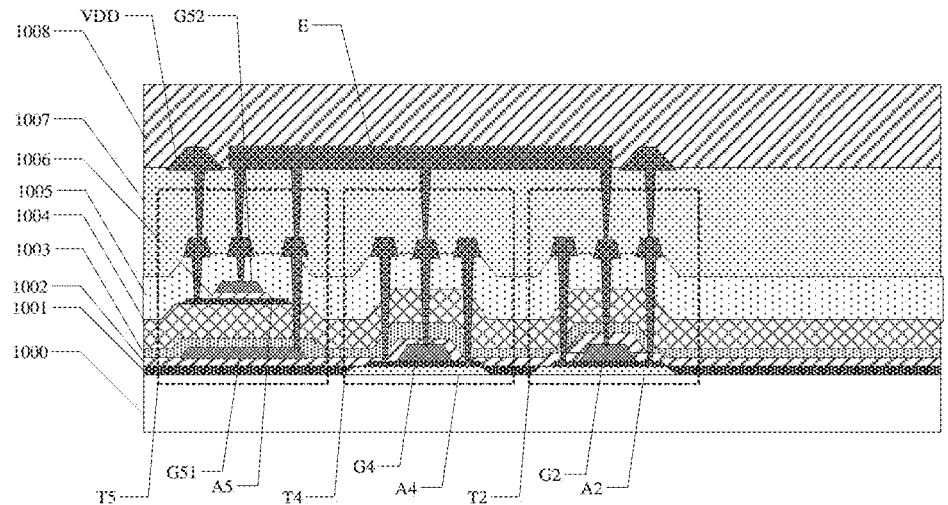
FIGS. 9B to 9I are cross-sectional views of a first light-emitting control transistor, a data writing transistor, and a compensation transistor in the pixel circuit shown in FIG. 4A.

FIG. 9A is a cross-sectional view of the first light-emitting control transistor, the driving transistor, and the second light-emitting control transistor in the pixel circuit shown in FIG. 4A or FIG. 5A. FIGS. 9B and 9I are cross-sectional views of the first light-emitting control transistor, the data writing transistor, and the compensation transistor in the pixel circuit shown in FIG. 4A or FIG. 5A.

For example, as shown in FIG. 9A, the gate electrode of the first light-emitting control transistor T5 comprises a first sub-gate electrode G51 and a second sub-gate electrode G52 located in different layers, and the active layer A5 of the first light-emitting control transistor is located between the first sub-gate electrode G51 and the second sub-gate electrode G52.

For example, as shown in FIG. 9B, the layer where the first sub-gate electrode G51 is located is located between the layer where the gate electrode G4 of the data writing transistor T4 is located and the layer where the second sub-gate electrode G52 is located.

The first sub-gate electrode G51 and the second sub-gate electrode of the first light-emitting control transistor T5 and the gate electrode G4 of the data writing transistor T4 are respectively connected to the first scanning signal line G1 (not shown in FIG. 9B) through the connection electrode E. The layer where the connection electrode E is located is located on a side of the layer where the second sub-gate electrode G52 is located away from the layer where the first sub-gate electrode G51 is located and the layer where the gate electrode G4 of the data writing transistor T4 is located.

For example, as shown in FIG. 9A, insulation layers 1001 to 1008 are sequentially formed on the base substrate 1000, and a first semiconductor layer, a first gate layer, a second gate layer, a second semiconductor layer, a third gate layer, a first conductive layer, a second conductive layer, and a third conductive layer, which are between the insulation layers, are sequentially formed.

For example, the anode 510 of the light-emitting element is located in the third conductive layer, and is connected to the second electrode of the sixth transistor T6 through a hole penetrating the insulation layer 1008, for example, the second electrode of the sixth transistor T6 is located in the second conductive layer or the first conductive layer, and the present disclosure does not limit this.

Figure 9C:
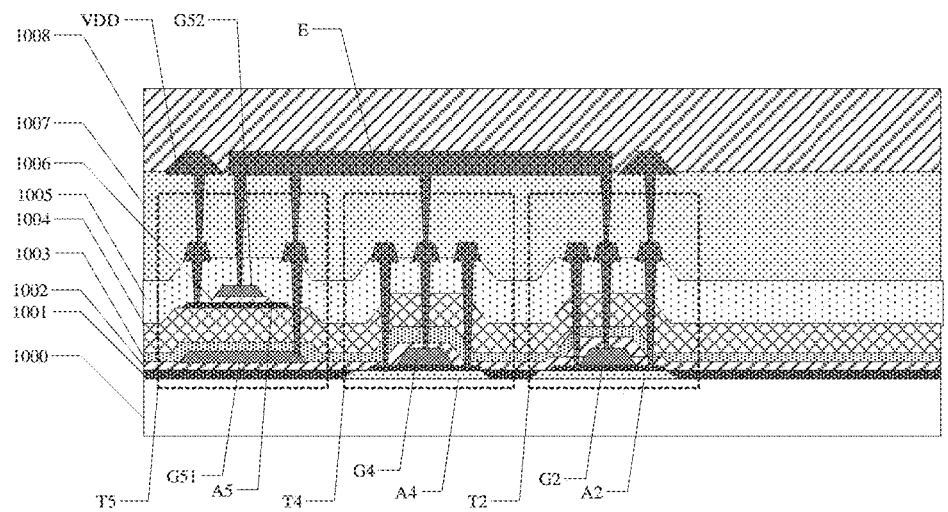
Figure 9D:
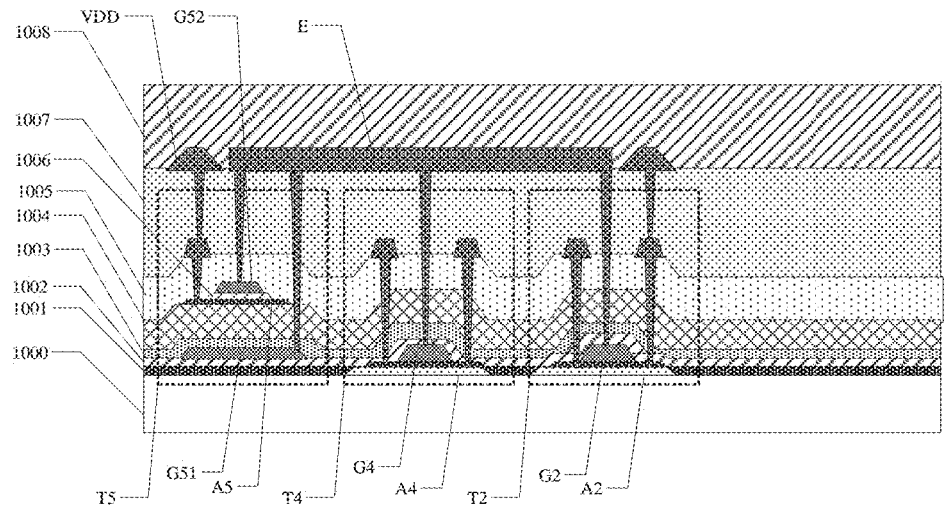
Figure 9E:
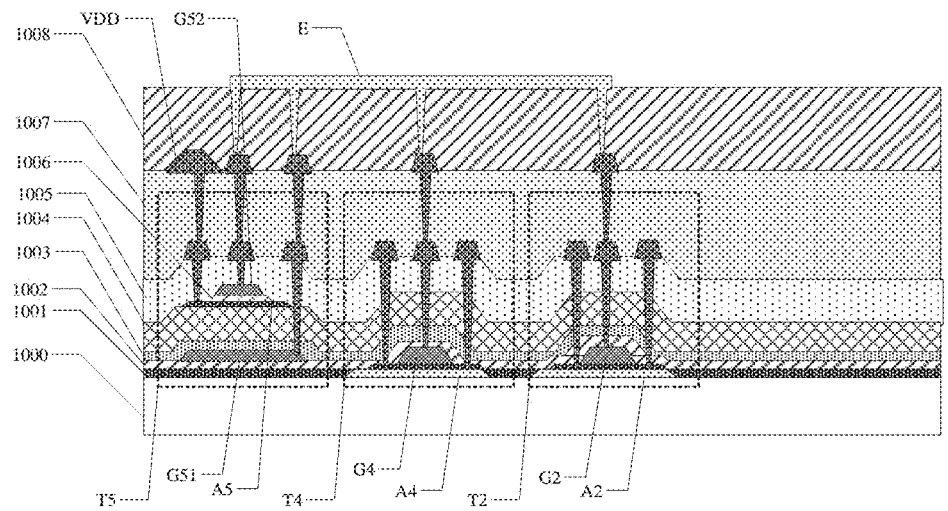
Figure 9F:
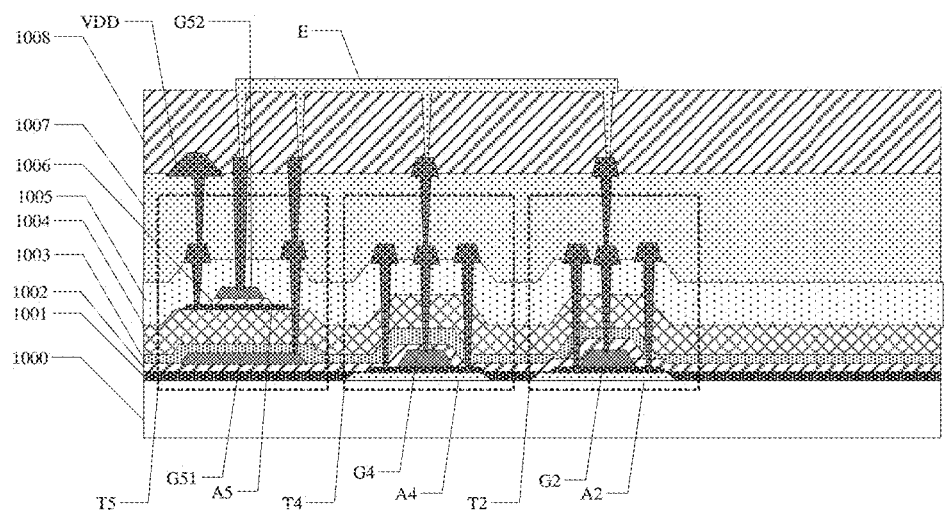
Figure 9G:
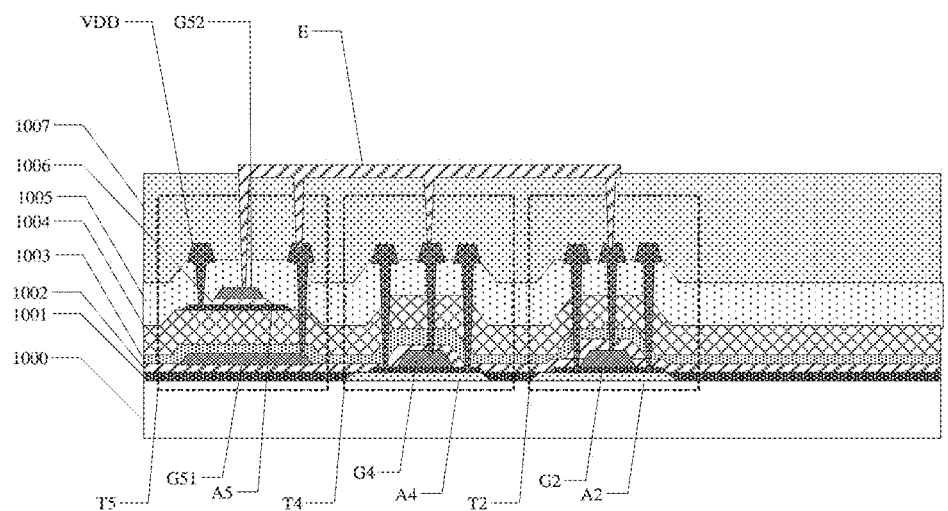
Figure 9H:
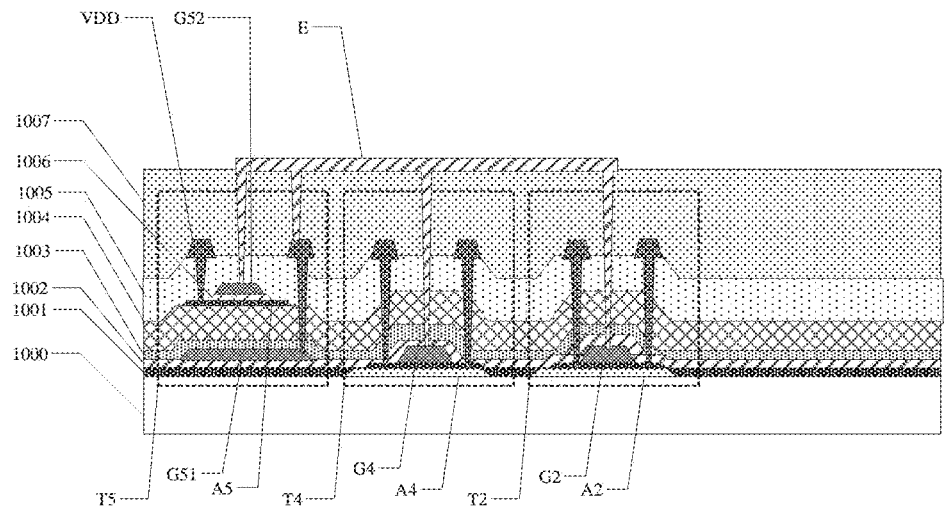
Figure 9I:
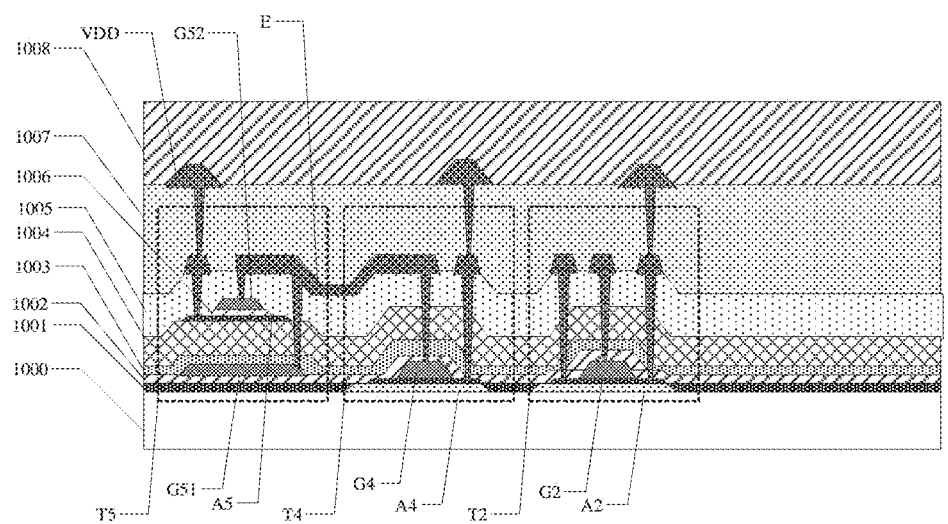

For example, as shown in FIGS. 9A-9F, the first power line VDD can be located in the second conductive layer, as shown in FIGS. 9G-9H, the first power line VDD can also be located in the first conductive layer, and the embodiments of the present disclosure do not limit this.

For example, when the first power line VDD is located in the second conductive layer, the first power line VDD can be connected to the first electrode of the first light-emitting control transistor T5 through the first conductive layer, the second electrode of the first light-emitting control transistor T5 is connected to the first electrode of the driving transistor T3 through a connection electrode located in the first conductive layer, and the active layer A3 of the driving transistor T3 is integrally formed with the active layer A6 of the second light-emitting control transistor T6, and is located in the first semiconductor layer.

For example, the second sub-gate electrode G52 is located in the third gate layer, the first sub-gate electrode G51 is located in the second gate layer, and the gate electrodes of other transistors (for example, G4, G2, G3, G6) are located in the first gate layer. For example, the active layer A5 of the first light-emitting control transistor is located in the second semiconductor layer, and the active layers of the remaining transistors (for example, A4, A2, A3, A6) are located in the first semiconductor layer.

For example, the connection electrode E can be connected to the respective gate electrodes (G51, G52, G4, G2) in the manner shown in FIG. 9B, for example, as shown in FIG. 9B, by connecting the connection electrode and each gate electrode with the electrode in the first conductive layer and/or second conductive layer located between the connection electrode and the second sub-gate electrode G52, a buffer can be formed to avoid the need for large holes.

Of course, each gate electrode (G51, G52, G4, and G2) can also be connected to the connection electrode E through a hole by the manner shown in FIG. 9C and FIG. 9D, which is not limited by the embodiments of the present disclosure.

For example, as shown in FIGS. 9E and 9F, the connection electrode can be set in the same layer as the anode 510 of the light-emitting element, or can be set in the same layer as the first power line VDD (as shown in FIGS. 9B to 9D); for example, as shown in FIG. 9I, the connection electrode can also be located in the first conductive layer, which is not limited in the embodiments of the present disclosure, as long as the data writing transistor T4 and the first light-emitting control transistor T5 can be connected through the connection electrode, but the gate electrode of the first light-emitting control transistor T5, the gate electrode of the compensation transistor T2, and the gate electrode of the data writing transistor T4 are not in the same layer, for example, as shown in FIG. 9I, the first sub-gate electrode G51 and the second sub-gate electrode G52 of the first light-emitting control transistor T5 are connected to the gate electrode G4 of the data writing transistor T4 through the connection electrode E located in the first conductive layer, and then the gate electrode G4 of the data writing transistor T4 is electrically connected to the gate electrode G2 of the compensation transistor T2 through a jumper connection mode, which is not limited in the embodiments of the present disclosure. It should be noted that the jumper connection part is not shown in FIG. 9I, and details may refer to designs in the field, and details are not repeated here.

For example, as shown in FIG. 9G, the connection electrode E can also be located in the second conductive layer, be connected to the electrode in the first conductive layer through the hole penetrating the insulation layer 1007, and then be connected to other gate electrodes through the electrode in the first conductive layer, and may also be directly connected to the respective gate electrodes through holes in the respective insulation layers (as shown in FIG. 9H). In this example, the first power line VDD is located in the first conductive layer.

For example, the base substrate 1000 may be made of glass, plastic, quartz, or other suitable materials, and the embodiments of the present disclosure do not limit this.

For example, the materials of the insulation layers 1001-1008 may include inorganic insulation materials such as SiNx, SiOx, SiNxOy, etc., and organic insulation materials such as organic resin, or other suitable materials, and the embodiments of the present disclosure do not limit this.

For example, the material of the semiconductor layer may comprise oxide semiconductor, organic semiconductor, or amorphous silicon, polysilicon, etc. For example, the oxide semiconductor comprises metal oxide semiconductor (such as indium gallium zinc oxide (IGZO)), and polysilicon comprises low-temperature polysilicon or high-temperature polysilicon etc., and the embodiments of the present disclosure do not limit this. It should be noted that, the above-mentioned source region and drain region may be regions doped with n-type impurities or p-type impurities, which is not limited in the embodiments of the present disclosure.

For example, the materials of the above-mentioned first conductive layer, the above-mentioned second conductive layer, and the above-mentioned third conductive layer may comprise titanium, titanium alloy, aluminum, aluminum alloy, copper, copper alloy, or any other suitable composite material, and the embodiments of the present disclosure do not limit this. For example, the materials of the first gate layer and the second gate layer may be the same as that of the first conductive layer, which will not be repeated here.

At least one embodiment of the present disclosure further provides a display panel, comprising a plurality of pixel units arranged in an array, and each of the plurality of pixel units comprises the pixel circuit provided by any embodiment of the present disclosure.

Figure 10:
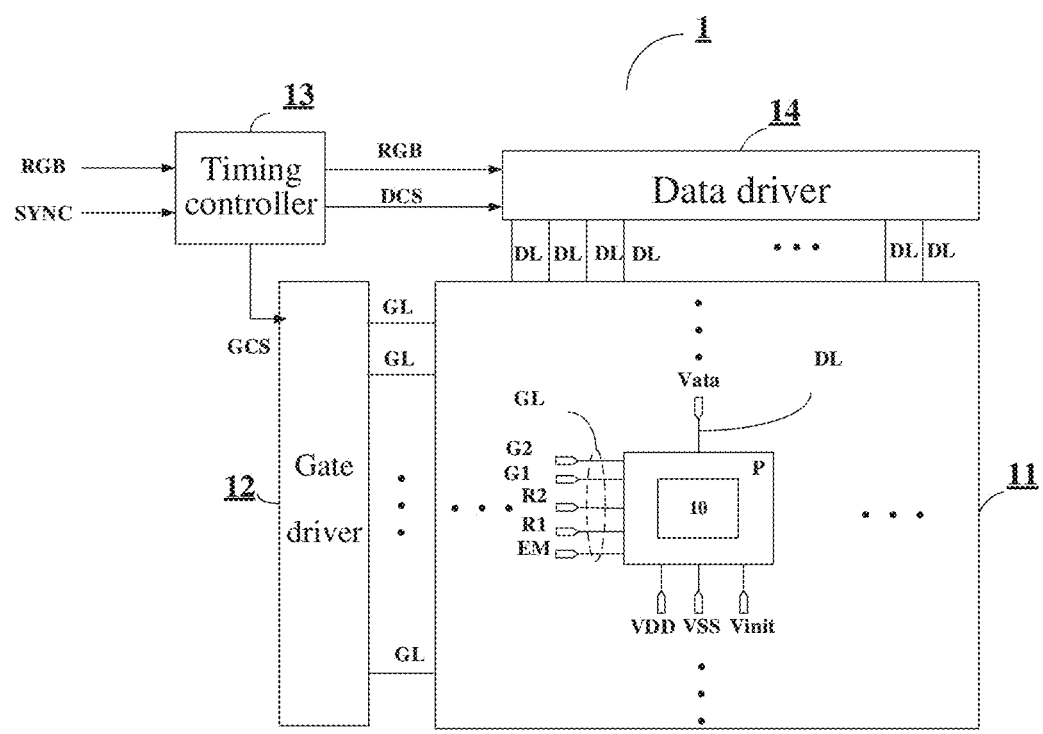
FIG. 10 is a schematic diagram of a display panel provided in an embodiment of the present disclosure.

FIG. 10 is a schematic block diagram of a display panel provided by an embodiment of the present disclosure. As shown in FIG. 10, the display panel 11 is arranged in the display device 1 and is electrically connected to a gate driver 12, a timing controller 13, and a data driver 14. The display panel 11 comprises pixel units P defined by intersections of a plurality of scanning lines GL and a plurality of data lines DL; the gate driver 12 is used to drive the plurality of scanning lines GL; the data driver 14 is used to drive the plurality of data lines DL; the timing controller 13 is used for processing the image data RGB input from the outside of the display device 1, providing the processed image data RGB to the data driver 14, and outputting the scanning control signal GCS and the data control signal DCS to the gate driver 12 and the data driver 14, so as to control the gate driver 12 and the data driver 14.

For example, the display panel 11 comprises a plurality of pixel units P, and the pixel unit P comprises any pixel circuit 10 provided in the above-mentioned embodiments, for example, comprises the pixel circuit 10 shown in FIG. 3. As shown in FIG. 10, the display panel 11 further comprises a plurality of scanning lines GL and a plurality of data lines DL. For example, the plurality of scanning lines are correspondingly connected to the data writing circuits 200 in the pixel circuits 10 of each row of pixel units to provide the first scanning signal, and the plurality of scanning lines are also correspondingly connected to the compensation storage circuits 300 and the reset circuits 700 in the pixel circuits 10 of each row of pixel units to provide the second scanning signal as the reset signal.

For example, the pixel unit P is disposed at the intersection region of the scan line GL and the data line DL. For example, as shown in FIG. 10, each pixel unit P is connected to a plurality of scanning lines GL (respectively providing the first scanning signal, the second scanning signal, the first reset signal, the second reset signal, and the light-emitting control signal), one data line DL, a first power line for supplying a first voltage, a second power line for supplying a second voltage, and a reset voltage line for supplying a reset voltage. For example, the first power line or the second power line can be replaced by a corresponding plate-shaped common electrode (e.g., common anode or common cathode). It should be noted that only part of the pixel units P, the scanning lines GL, and the data lines DL are shown in FIG. 10. It should be noted that, in the embodiment of the present disclosure, because the second scanning signal provided by the second scanning signal line can be the same as the first scanning signal, and the first reset signal can be the same as the second reset signal, so each pixel unit P can be connected to only 3 scanning lines GL. It should be noted that the following embodiments are the same as those described therein and will not be repeated again.

For example, in some examples, the plurality of pixel units P are arranged in a plurality of rows, and the compensation storage circuits 300, the data writing circuits 200, and the first light-emitting control circuits 400 of the pixel circuits in each row of pixel units P are connected to the same scanning line GL, and the embodiments of the present disclosure do not limit this. For example, the data line DL of each column is connected to the data writing circuits 200 in the pixel circuits 10 of this column to provide a data signal.

For example, the gate driver 12 supplies a plurality of gate signals to the plurality of scanning lines GL according to a plurality of scanning control signals GCS from the timing controller 13. The plurality of gate signals comprise a first scanning signal, a second scanning signal, a light-emitting control signal, and a reset signal. These signals are supplied to each pixel unit P through a plurality of scanning lines GL.

For example, the data driver 14 converts digital image data RGB input from the timing controller 13 into data signals according to a plurality of data control signals DCS from the timing controller 13 using a reference gamma voltage. The data driver 14 supplies the converted data signals to the plurality of data lines DL.

For example, the timing controller 13 processes externally input image data RGB to match the size and resolution of the display panel 11, and then supplies the processed image data to the data driver 14. The timing controller 13 generates the plurality of scanning control signals GCS and the plurality of data control signals DCS using synchronous signals (such as a dot clock DCLK, a data enable signal DE, a horizontal synchronous signal Hsync, and a vertical synchronous signal Vsync) input from the outside of the display device. The timing controller 13 provides the generated scanning control signal GCS and the generated data control signal DCS to the gate driver 12 and the data driver 14 respectively for controlling the gate driver 12 and the data driver 14.

For example, the data driver 14 can be connected to the plurality of data lines DL to provide the data signals Vdata; meanwhile, the data driver 14 can also be connected to a plurality of first power lines, a plurality of second power lines, and a plurality of reset voltage lines to provide the first voltage, the second voltage, and the reset voltage.

For example, the gate driver 12 and the data driver 14 may be implemented as semiconductor chips. The display device 1 may also comprise other components, such as a signal decoding circuit, a voltage conversion circuit, etc. These components may be existing conventional components, and will not be described in detail here.

For example, the display panel 11 provided in the embodiment can be applied to any product or component with a display function, such as an electronic paper, a mobile phone, a tablet computer, a television, a monitor, a notebook computer, a digital photo frame, a navigator, and the like.

Regarding the technical effect of the display panel 11, reference may be made to the technical effect of the pixel circuit 10 provided in the embodiments of the present disclosure, which will not be repeated here.

The embodiment of the present disclosure also provides a driving method, which can be used to drive the pixel circuit 10 provided by the embodiment of the present disclosure. For example, in the example shown in FIG. 2, the driving method comprises a reset phase, a data writing and compensation phase, and a light-emitting phase.

In the reset phase, a first level of the first scanning signal is input through the first scanning signal line to turn on the first light-emitting control circuit, and the first voltage is applied to the first terminal of the driving circuit through the first light-emitting control circuit that is turned on.

In the data writing and compensation phase, a second level of the first scanning signal is input through the first scanning signal line to turn on the data writing circuit, the second scanning signal is input through the second scanning signal line to turn on the compensation storage circuit, the data signal is input through a data line, the data signal is written into the first terminal of the driving circuit through the data writing circuit that is turned on to turn on the driving circuit, the data signal is stored through the compensation storage circuit that is turned on, and the driving circuit is compensated through the compensation storage circuit that is turned on.

In the light-emitting phase, the first scanning signal is input through the first scanning signal line to turn on the first light-emitting control circuit and the driving circuit, the light-emitting control signal is input through the light-emitting control signal line to turn on the second light-emitting control circuit, and the driving current is applied to the light-emitting element through the first light-emitting control circuit, the driving circuit, and the second light-emitting control circuit, which are turned on, to cause the light-emitting element to emit light.

For example, in the example shown in FIG. 3, when the pixel circuit further comprises a reset circuit, the driving method comprises the following operations:

in the reset phase, the reset signal is input to turn on the reset circuit, and the reset voltage is applied to the first terminal of the light-emitting element and the control terminal of the driving circuit through the reset circuit that is turned on.

It should be noted that, for a detailed description of the driving method, reference may be made to the description of the working principle of the pixel circuit 10 in the embodiments of the present disclosure, which will not be repeated here.

The following points need to be explained:
(1) The drawings of the embodiment of the present disclosure only relate to the structure related to the embodiment of the present disclosure, and other structures can refer to the general design.
(2) In case of no conflict, the embodiment of the present disclosure and the features in the embodiment can be combined with each other to obtain a new embodiment.

The above is only an exemplary embodiment of the present invention, and is not used to limit the scope of protection of the present invention, which is determined by the appended claims.

What is claimed is:
1. A pixel circuit, comprising: a driving circuit, a data writing circuit, a compensation storage circuit, a first light-emitting control circuit, and a second light-emitting control circuit, wherein the driving circuit comprises a control terminal, a first terminal, and a second terminal, and is configured to control a driving current flowing through the first terminal and the second terminal for driving a light-emitting element to emit light;

the data writing circuit is connected to the first terminal of the driving circuit and a first scanning signal line, and is configured to write a data signal to the first terminal of the driving circuit in response to a first scanning signal provided by the first scanning signal line;

the compensation storage circuit is connected to the control terminal and the second terminal of the driving circuit, and is also connected to a second scanning signal line and a first power line, and is configured to store the data signal written by the data writing circuit in response to a second scanning signal provided by the second scanning signal line and to compensate for the driving circuit;

the first light-emitting control circuit is connected to the first terminal of the driving circuit, the first power line, and the first scanning signal line, and is configured to apply a first voltage of the first power line to the first terminal of the driving circuit in response to the first scanning signal provided by the first scanning signal line, wherein a conductive state of the data writing circuit and a conductive state of the first light-emitting control circuit under control of the first scanning signal are mutually exclusive; and the second light-emitting control circuit is connected to the second terminal of the driving circuit, a light-emitting control signal line, and a first terminal of the light-emitting element, and is configured to apply the driving current to the light-emitting element in response to a light-emitting control signal provided by the light-emitting control signal line, wherein the first light-emitting control circuit comprises a first light-emitting control transistor, and the data writing circuit comprises a data writing transistor, a gate electrode of the first light-emitting control transistor comprises a first sub-gate electrode and a second sub-gate electrode located at different layers, and an active layer of the first light-emitting control transistor is located between the first sub-gate electrode and the second sub-gate electrode, a layer where the first sub-gate electrode is located is between a layer where a gate electrode of the data writing transistor is located and a layer where the second sub-gate electrode is located, the first sub-gate electrode and the second sub-gate electrode of the first light-emitting control transistor and the gate electrode of the data writing transistor are connected to the first scanning signal line through connection electrodes, respectively, and a layer where the connection electrodes are located is on a side of the layer where the second sub-gate electrode is located away from the layer where the first sub-gate electrode is located and the layer where the gate electrode of the data writing transistor is located.

2. The pixel circuit according to claim 1, wherein the driving circuit comprises a driving transistor, a gate electrode of the driving transistor serves as the control terminal of the driving circuit, a first electrode of the driving transistor serves as the first terminal of the driving circuit, and a second electrode of the driving transistor serves as the second terminal of the driving circuit.

3. The pixel circuit according to claim 1, wherein the gate electrode of the data writing transistor is connected to the first scanning signal line to receive the first scanning signal, a first electrode of the data writing transistor is connected to a data line to receive the data signal, and a second electrode of the data writing transistor is connected to the first terminal of the driving circuit.

4. The pixel circuit according to claim 3, wherein the gate electrode of the first light-emitting control transistor is connected to the first scanning signal line to receive the first scanning signal, a first electrode of the first light-emitting control transistor is connected to the first power line to receive the first voltage, and a second electrode of the first light-emitting control transistor is connected to the first terminal of the driving circuit.

5. The pixel circuit according to claim 1, wherein a type of the data writing transistor is different from a type of the first light-emitting control transistor.

6. The pixel circuit according to claim 1, wherein the first light-emitting control transistor is an N-type transistor, and the data writing transistor is a P-type transistor.

7. The pixel circuit according to claim 4, wherein the compensation storage circuit comprises a compensation transistor and a storage capacitor;

a gate electrode of the compensation transistor is connected to the second scanning signal line to receive the second scanning signal, a first electrode of the compensation transistor is connected to the second terminal of the driving circuit, and a second electrode of the compensation transistor is connected to the control terminal of the driving circuit; and a first electrode of the storage capacitor is connected to the control terminal of the driving circuit, and a second electrode of the storage capacitor is connected to the first power line.

8. The pixel circuit according to claim 1, wherein the first scanning signal line and the second scanning signal line are same or different, and the first scanning signal and the second scanning signal are same or different.

9. The pixel circuit according to claim 7, wherein, when the first scanning signal and the second scanning signal are different, a type of the data writing transistor is different from a type of the compensation transistor, and the type of the compensation transistor is the same as a type of the first light-emitting control transistor.

10. The pixel circuit according to claim 1, further comprising a reset circuit, wherein the reset circuit is connected to an initial voltage terminal, the first terminal of the light-emitting element, and the control terminal of the driving circuit, and is configured to apply a reset voltage provided by the initial voltage terminal to the first terminal of the light-emitting element and the control terminal of the driving circuit in response to a reset signal.

11. The pixel circuit according to claim 10, wherein the reset circuit comprises a first reset transistor and a second reset transistor;

a gate electrode of the first reset transistor is connected to a first reset signal line to receive a first reset signal as the reset signal, a first electrode of the first reset transistor is connected to the initial voltage terminal to receive the reset voltage, and a second electrode of the first reset transistor is connected to the control terminal of the driving circuit;

a gate electrode of the second reset transistor is connected to a second reset signal line to receive a second reset signal as the reset signal, a first electrode of the second reset transistor is connected to the initial voltage terminal to receive the reset voltage, and a second electrode of the second reset transistor is connected to the first terminal of the light-emitting element.

12. The pixel circuit according to claim 11, wherein the first reset signal line and the second reset signal line are same or different, and the first reset signal and the second reset signal are same or different.

13. The pixel circuit according to claim 1, wherein the second light-emitting control circuit comprises a second light-emitting control transistor, a gate electrode of the second light-emitting control transistor is connected to the light-emitting control signal line to receive the light-emitting control signal, a first electrode of the second light-emitting control transistor is connected to the second terminal of the driving circuit, and a second electrode of the second light-emitting control transistor is connected to the first terminal of the light-emitting element.

14. A driving method for the pixel circuit according to claim 1, comprising a reset phase, a data writing and compensation phase, and a light-emitting phase;

wherein, in the reset phase, a first level of the first scanning signal is input through the first scanning signal line to turn on the first light-emitting control circuit, and the first voltage is applied to the first terminal of the driving circuit through the first light-emitting control circuit that is turned on;

in the data writing and compensation phase, a second level of the first scanning signal is input through the first scanning signal line to turn on the data writing circuit, the second scanning signal is input through the second scanning signal line to turn on the compensation storage circuit, the data signal is input through a data line, the data signal is written into the first terminal of the driving circuit through the data writing circuit that is turned on to turn on the driving circuit, the data signal is stored through the compensation storage circuit that is turned on, and the driving circuit is compensated through the compensation storage circuit that is turned on; and in the light-emitting phase, the first scanning signal is input through the first scanning signal line to turn on the first light-emitting control circuit and the driving circuit, the light-emitting control signal is input through the light-emitting control signal line to turn on the second light-emitting control circuit, and the driving current is applied to the light-emitting element through the first light-emitting control circuit, the driving circuit, and the second light-emitting control circuit, which are turned on, to cause the light-emitting element to emit light.

15. The driving method according to claim 14, wherein the pixel circuit further comprises a reset circuit, wherein the reset circuit is connected to an initial voltage terminal, the first terminal of the light-emitting element, and the control terminal of the driving circuit, and is configured to apply a reset voltage to the first terminal of the light-emitting element and the control terminal of the driving circuit in response to a reset signal, wherein the method further comprises:

in the reset phase, the reset signal is input to turn on the reset circuit, and the reset voltage is applied to the first terminal of the light-emitting element and the control terminal of the driving circuit through the reset circuit that is turned on.

16. A display panel, comprising the pixel circuit according to claim 1.

17. The pixel circuit according to claim 2, wherein the gate electrode of the data writing transistor is connected to the first scanning signal line to receive the first scanning signal, a first electrode of the data writing transistor is connected to a data line to receive the data signal, and a second electrode of the data writing transistor is connected to the first terminal of the driving circuit.

18. The pixel circuit according to claim 5, wherein the first light-emitting control transistor is an N-type transistor, and the data writing transistor is a P-type transistor.

19. The pixel circuit according to claim 5, wherein the compensation storage circuit comprises a compensation transistor and a storage capacitor;

a gate electrode of the compensation transistor is connected to the second scanning signal line to receive the second scanning signal, a first electrode of the compensation transistor is connected to the second terminal of the driving circuit, and a second electrode of the compensation transistor is connected to the control terminal of the driving circuit; and a first electrode of the storage capacitor is connected to the control terminal of the driving circuit, and a second electrode of the storage capacitor is connected to the first power line.

* * * * *